(12) United States Patent
Harada et al.

(10) Patent No.: US 8,313,886 B2
(45) Date of Patent: Nov. 20, 2012

(54) RESIST COMPOSITION AND PATTERNING PROCESS

(75) Inventors: Yuji Harada, Joetsu (JP); Jun Hatakeyama, Joetsu (JP); Koji Hasegawa, Joetsu (JP); Tomohiro Kobatashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 193 days.

(21) Appl. No.: 12/761,202

(22) Filed: Apr. 15, 2010

(65) Prior Publication Data

US 2010/0266957 A1 Oct. 21, 2010

(30) Foreign Application Priority Data

Apr. 16, 2009 (JP) ................. 2009-100043

(51) Int. Cl.
*G03F 7/004* (2006.01)
*G03F 7/028* (2006.01)
*G03F 7/039* (2006.01)
*G03F 7/26* (2006.01)

(52) U.S. Cl. ............ 430/270.1; 430/296; 430/326

(58) Field of Classification Search ............ 430/270.1, 430/326, 296
See application file for complete search history.

(56) References Cited

U.S. PATENT DOCUMENTS

| | | | |
|---|---|---|---|
| 5,541,037 A | 7/1996 | Hatakeyama et al. | |
| 6,312,867 B1 | 11/2001 | Kinsho et al. | |
| 6,869,744 B2 | 3/2005 | Hatakeyama | |
| 7,244,545 B2 | 7/2007 | Takebe et al. | |
| 7,455,952 B2 | 11/2008 | Hatakeyama et al. | |
| 7,537,880 B2 | 5/2009 | Harada et al. | |
| 8,221,956 B2 | 7/2012 | Shiono et al. | |
| 2005/0277059 A1* | 12/2005 | Kanda | 430/270.1 |
| 2006/0008736 A1 | 1/2006 | Kanda et al. | |
| 2006/0076509 A1* | 4/2006 | Okino et al. | 250/492.2 |
| 2006/0246373 A1 | 11/2006 | Wang | |
| 2006/0269871 A1 | 11/2006 | Harada et al. | |
| 2007/0122736 A1 | 5/2007 | Hatakeyama et al. | |
| 2007/0166639 A1 | 7/2007 | Araki et al. | |
| 2007/0231738 A1* | 10/2007 | Kaneko et al. | 430/270.1 |
| 2008/0032202 A1 | 2/2008 | Ishizuka et al. | |
| 2008/0090172 A1 | 4/2008 | Hatakeyama et al. | |
| 2009/0053650 A1 | 2/2009 | Irie | |
| 2009/0197204 A1* | 8/2009 | Shiono et al. | 430/286.1 |
| 2010/0248164 A1* | 9/2010 | Kumagai et al. | 430/325 |
| 2011/0151381 A1* | 6/2011 | Hasegawa et al. | 430/285.1 |

FOREIGN PATENT DOCUMENTS

| | | | |
|---|---|---|---|
| JP | 60-38821 A | 2/1985 |
| JP | 62-62520 A | 3/1987 |
| JP | 62-62521 A | 3/1987 |
| JP | 6-273926 A | 9/1994 |
| JP | 9-246173 A | 9/1997 |
| JP | 2803549 B2 | 9/1998 |
| JP | 2000-336121 A | 12/2000 |
| JP | 2005-264131 A | 9/2005 |
| JP | 2006-48029 A | 2/2006 |
| JP | 2006-91798 A | 4/2006 |
| JP | 2006-133716 A | 5/2006 |
| JP | 2006-309245 A | 11/2006 |
| JP | 2006-328259 A | 12/2006 |
| JP | 2007-140446 A | 6/2007 |
| JP | 2007-187887 A | 7/2007 |
| JP | 2008-111103 A | 5/2008 |
| JP | 2008-122932 A | 5/2008 |
| JP | 2010-2870 A | 1/2010 |
| JP | 2010-197413 A | 9/2010 |
| WO | 2005/042453 A1 | 5/2005 |
| WO | 2005/069676 A1 | 7/2005 |

OTHER PUBLICATIONS

Allen et al., "Design of Protective Topcoats for Immersion Lithography", Journal of Photopolymer Science and Technology, vol. 18, No. 5, 2005, pp. 615-619.

Hirayama., "Resist and Cover Material Investigation for immersion Lithography", 2nd Immersion Workshop, Jul. 11, 2003.

Ito et al., "Aliphatic platforms for the design of 157 nm chemically amplified resists", Proceedings of SPIE, vol. 4690, 2002, pp. 18-28.

Lin., "Semiconductor Foundry, Lithography, and Partners Micropatterning Division", TSMC, Inc. Proc. SPIE, vol. 4690, xxix, 2002.

Murase et al., "Characterization of molecular interfaces in hydrophobic systems", Progress in Organic Coatings, vol. 31, 1997, pp. 97-104.

Murase et al., "Neuer Begriff and ein Nano-Hybrid System für Hydrophobie", XXIV FATIPEC Congress Book, vol. 1 B, pp. 15-38, 1997.

(Continued)

*Primary Examiner* — Anca Eoff
(74) *Attorney, Agent, or Firm* — Birch, Stewart, Kolasch & Birch, LLP

(57) ABSTRACT

An additive polymer comprising recurring units of formula (1) is added to a resist composition comprising a base resin, a photoacid generator, and an organic solvent. $R^1$ is hydrogen or methyl, $R^2$ is alkylene or fluoroalkylene, and $R^3$ is fluoroalkyl. The additive polymer is highly transparent to radiation with wavelength of up to 200 nm. Water repellency, water slip, acid lability, hydrolysis and other properties of the polymer may be adjusted by a choice of polymer structure.

(1)

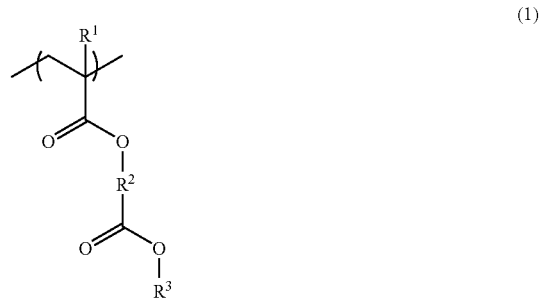

14 Claims, No Drawings

OTHER PUBLICATIONS

Nakano et al., "Defectivity data taken with a full-field immersion exposure tool", 2nd International Symposium on Immersion Lithography, Sep. 12-15, 2005.

Owa et al., "Immersion lithography; its potential performance and issues", Proceedings of SPIE, vol. 5040, 2003, p. 724.

Shirota et al., "Development of non-topcoat resist polymers for 193-nm immersion lithography", Proceedings of SPIE, vol. 6519, 2007, pp. 651905-1-651905-11.

Japanese Office Action dated Jul. 11, 2012, for Japanese Application No. 2009-100043.

* cited by examiner

RESIST COMPOSITION AND PATTERNING PROCESS

CROSS-REFERENCE TO RELATED APPLICATION

This non-provisional application claims priority under 35 U.S.C. §119(a) on Patent Application No. 2009-100043 filed in Japan on Apr. 16, 2009, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. More particularly, it relates to a resist composition for use in the lithography process and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF excimer laser (248 nm) enabled mass-scale production of dynamic random access memories (DRAM) with an integration degree of 64 MB (processing feature size $\leq 0.25$ µm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\geq$0.9), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p 724, 2003).

Several problems arise when a resist film is exposed in the presence of water. For example, the acid once generated from a photoacid generator and a basic compound added to the resist material can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see 2nd Immersion Workshop: Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A H06-273926, JP 2803549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble resist protective coating materials, for example, resins having alkali-soluble groups such as fluorinated alcohol, carboxyl or sulfo groups on side chains. See WO 2005/42453, WO 2005/69676, JP-A 2005-264131, JP-A 2006-133716, and JP-A 2006-91798.

As means for preventing resist components from being leached out and water from penetrating into the resist film without a need for a protective coating material, it is proposed in JP-A 2006-48029, JP-A 2006-309245, and JP-A 2007-187887 to add an alkali-soluble, hydrophobic compound as a surfactant to the resist material. This method achieves equivalent effects to the use of resist protective coating material because the hydrophobic compound is segregated at the resist surface during resist film formation. Additionally, this method is economically advantageous over the use of a resist protective film because steps of forming and stripping the protective film are unnecessary.

Independent of whether the resist protective coating material or alkali-soluble additive is used, the immersion lithography places the requirement of higher throughputs than ever from the standpoint of productivity. To attain the goal, the exposure time must be reduced. Exposure must be carried out by scanning the wafer-holding stage at a high speed of 300 to 700 nm/sec while water is partly held between the projection lens and the wafer. In the event of such high-speed scanning, unless the performance of the resist or protective film is sufficient, water cannot be held between the projection lens and the wafer. Water droplets are left on the surface of the resist film or protective film after scanning. It is believed that residual droplets cause defective pattern formation.

To eliminate the droplets remaining on the surface of the photoresist or protective film after scanning, it is necessary to improve the flow or mobility of water (hereinafter, water slip) on the relevant coating film and the water repellency thereof. It is reported that the defects associated with residual droplets can be obviated by increasing the receding contact angle of the photoresist or protective film with water. See 2nd International Symposium on Immersion Lithography, 12-15 Sep., 2005, Defectivity data taken with a full-field immersion exposure tool, Nakano et al. It is reported that introduction of fluorine into a base resin is effective for improving water repellency and formation of micro-domain structure by a combination of different water repellent groups is effective for improving water slip. See XXIV FATIPEC Congress Book, Vol. B, p 15 (1997) and Progress in Organic Coatings, 31, p 97 (1997).

One exemplary material known to have excellent water slip and water repellency on film surface is a copolymer of α-trifluoromethylacrylate and norbornene derivative (Proc. SPIE Vol. 4690, p 18, 2002). While this polymer was developed as the highly transparent resin for $F_2$ (157 nm) lithography resist materials, it is characterized by a regular arrangement of molecules of (highly water repellent) α-trifluoromethylacrylate and norbornene derivative in a ratio of 2:1. When a water molecule interacts with methyl and trifluoromethyl groups, it orients via its oxygen and hydrogen atoms, respectively, and the orientation distance between water and methyl is longer. A resin having a regular arrangement of both substituent groups is improved in water slip because of a longer orientation distance of water. In fact, when this polymer is used as the base polymer in a protective coating for immersion lithography, water slip is drastically improved (see US 20070122736 or JP-A 2007-140446).

Another example of the highly water repellent/water slippery material is a fluorinated ring-closing polymerization polymer having hexafluoroalcohol groups on side chains. This polymer is further improved in water slip by protecting hydroxyl groups on side chains with acid labile groups, as reported in Proc. SPIE Vol. 6519, p 651905 (2007).

Although the introduction of fluorine into resins is effective for improving water repellency and water slip, the introduction of extra fluorine results in resins with a greater surface contact angle following alkaline development. As a result, those defects so called "blob defects" occur on the resist film surface (especially in the unexposed area) after development. It is believed that blob defects form during spin drying after development. The internal energy accumulating in residual water droplets on a resist film causes damages to the resist film surface in the spin drying step, which are observable as blob defects.

In general, the internal energy of a water droplet on a film is higher as the film becomes more water repellent. A fluororesin having high water repellency tends to induce blob defects. For the purpose of suppressing the occurrence of blob defects, the surface contact angle after development must be reduced in order to reduce the internal energy of a water droplet. One approach is to introduce highly hydrophilic groups (e.g., carboxyl or sulfo groups) into a resin, but these groups serve to reduce the water repellency and water slip of the resin, which becomes not applicable to high-speed scanning. There is a desire to have a resin material which can reduce a surface contact angle after development (so as to minimize blob defects) while maintaining highly water repellent and water slip properties during immersion lithography.

The highly water repellent/water slippery materials discussed above are expected to be applied not only to the ArF immersion lithography, but also to the resist material for mask blanks. Resist materials for mask blanks suffer from problems including a change of sensitivity during long-term exposure in vacuum and stability after coating. With respect to the control of sensitivity changes in vacuum, an improvement is made by a combination of acid labile groups of acetal and tertiary ester types (U.S. Pat. No. 6,869,744). It is believed that a resist film resulting from coating of a resist material varies its sensitivity or profile as an amine component is adsorbed to the resist film surface after coating. A method of modifying the surface of a resist film for preventing adsorption of an amine component to the resist film has been devised.

CITATION LIST

Patent Document 1: JP-A S62-62520
Patent Document 2: JP-A S62-62521
Patent Document 3: JP-A S60-38821
Patent Document 4: JP-A H06-273926
Patent Document 5: JP 2803549
Patent Document 6: WO 2005/42453
Patent Document 7: WO 2005/69676
Patent Document 8: JP-A 2005-264131
Patent Document 9: JP-A 2006-133716
Patent Document 10: U.S. Pat. No. 7,455,952 (JP-A 2006-91798)
Patent Document 11: JP-A 2006-048029
Patent Document 12: JP-A 2006-309245
Patent Document 13: JP-A 2007-187887
Patent Document 14: US 20070122736 (JP-A 2007-140446)
Patent Document 15: U.S. Pat. No. 6,869,744
Non-Patent Document 1: Proc. SPIE Vol. 4690, xxix,
Non-Patent Document 2: Proc. SPIE Vol. 5040, p 724, 2003
Non-Patent Document 3: 2nd Immersion Workshop: Resist and Cover Material Investigation for Immersion Lithography (2003)
Non-Patent Document 4: J. Photopolymer Sci. and Technol., Vol. 18, No. 5, p 615, 2005
Non-Patent Document 5: 2nd International Symposium on Immersion Lithography, 12-15 Sep., 2005, Defectivity data taken with a full-field immersion exposure tool, Nakano et al.
Non-Patent Document 6: XXIV FATIPEC Congress Book, Vol. B, p 15 (1997)
Non-Patent Document 7: Progress in Organic Coatings, 31, p 97 (1997)
Non-Patent Document 8: Proc. SPIE Vol. 4690, p 18 (2002)
Non-Patent Document 9: Proc. SPIE Vol. 6519, p 651905 (2007)

SUMMARY OF INVENTION

An object of the invention is to provide a resist composition for the immersion lithography which contains an additive polymer so that the composition exhibits excellent water repellency and water slip and forms a resist pattern of satisfactory profile after development, the pattern having few development defects; and a pattern forming process using the composition. The additive polymer used herein is highly transparent to radiation with wavelength of up to 200 nm. Various properties of the polymer including water repellency, water slip, fat solubility, acid lability, and hydrolysis may be adjusted by a choice of polymer structure. The polymer can be prepared from reactants which are readily available and easy to handle.

The inventors have found that a polymer comprising recurring units structured to have a fluorinated ester at the distal end of their side chain (as represented by the general formula (1) below) exhibits excellent water repellency and water slip and is effective for reducing development defects as a result of the ester being susceptible to alkaline hydrolysis in a developer.

Accordingly, the present invention provides a resist composition and a pattern forming process, as defined below.

[1] A resist composition comprising (A) a polymer comprising recurring units of the following general formula (1), (B) a polymer which becomes soluble in an alkaline developer under the action of an acid as a base resin, (C) a compound capable of generating an acid upon exposure to high-energy radiation, and (D) an organic solvent.

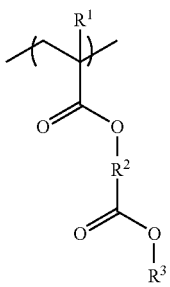
(1)

Herein R¹ is hydrogen or methyl, R² is a straight, branched or cyclic $C_1$-$C_{15}$ alkylene or fluoroalkylene group, and R³ is a straight, branched or cyclic $C_1$-$C_{15}$ fluoroalkyl group.

[2] The resist composition of [1] comprising (A) a polymer comprising recurring units of the following general formula (1a), (B) a polymer which becomes soluble in an alkaline developer under the action of an acid as a base resin, (C) a compound capable of generating an acid upon exposure to high-energy radiation, and (D) an organic solvent.

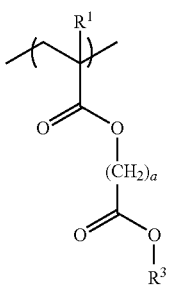
(1a)

Herein R² is hydrogen or methyl, R³ is a straight, branched or cyclic $C_1$-$C_{15}$ fluoroalkyl group, and "a" is an integer of 1 to 6.

[3] A resist composition comprising (A) a polymer comprising recurring units of the following general formula (1') or (1a'), (B) a polymer which becomes soluble in an alkaline developer under the action of an acid as a base resin, (C) a compound capable of generating an acid upon exposure to high-energy radiation, and (D) an organic solvent.

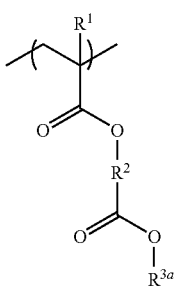
(1')

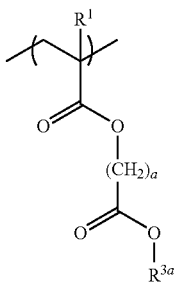
(1a')

Herein R¹ is hydrogen or methyl, R² is a straight, branched or cyclic $C_1$-$C_{15}$ alkylene or fluoroalkylene group, $R^{3a}$ is selected from the group consisting of 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl, and "a" is an integer of 1 to 6.

[4] A resist composition comprising (A) a polymer comprising recurring units of the general formula (1) in [1], formula (1a) in [2], or formula (1') or (1a') in [3], and additional recurring units of one or multiple types selected from the following general formulae (2a) to (2f), (B) a polymer which becomes soluble in an alkaline developer under the action of an acid as a base resin, (C) a compound capable of generating an acid upon exposure to high-energy radiation, and (D) an organic solvent.

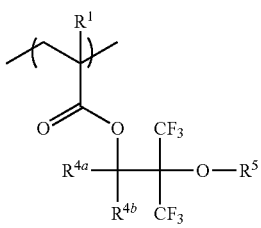
(2a)

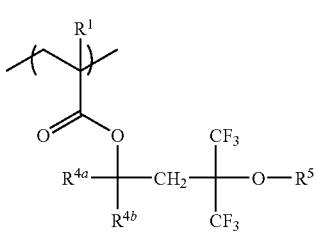
(2b)

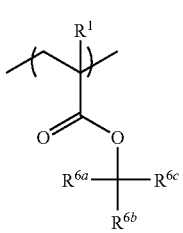
(2c)

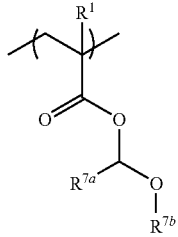
(2d)

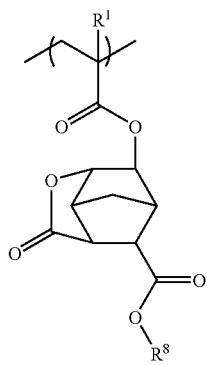
(2e)

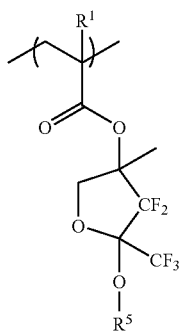
(2f)

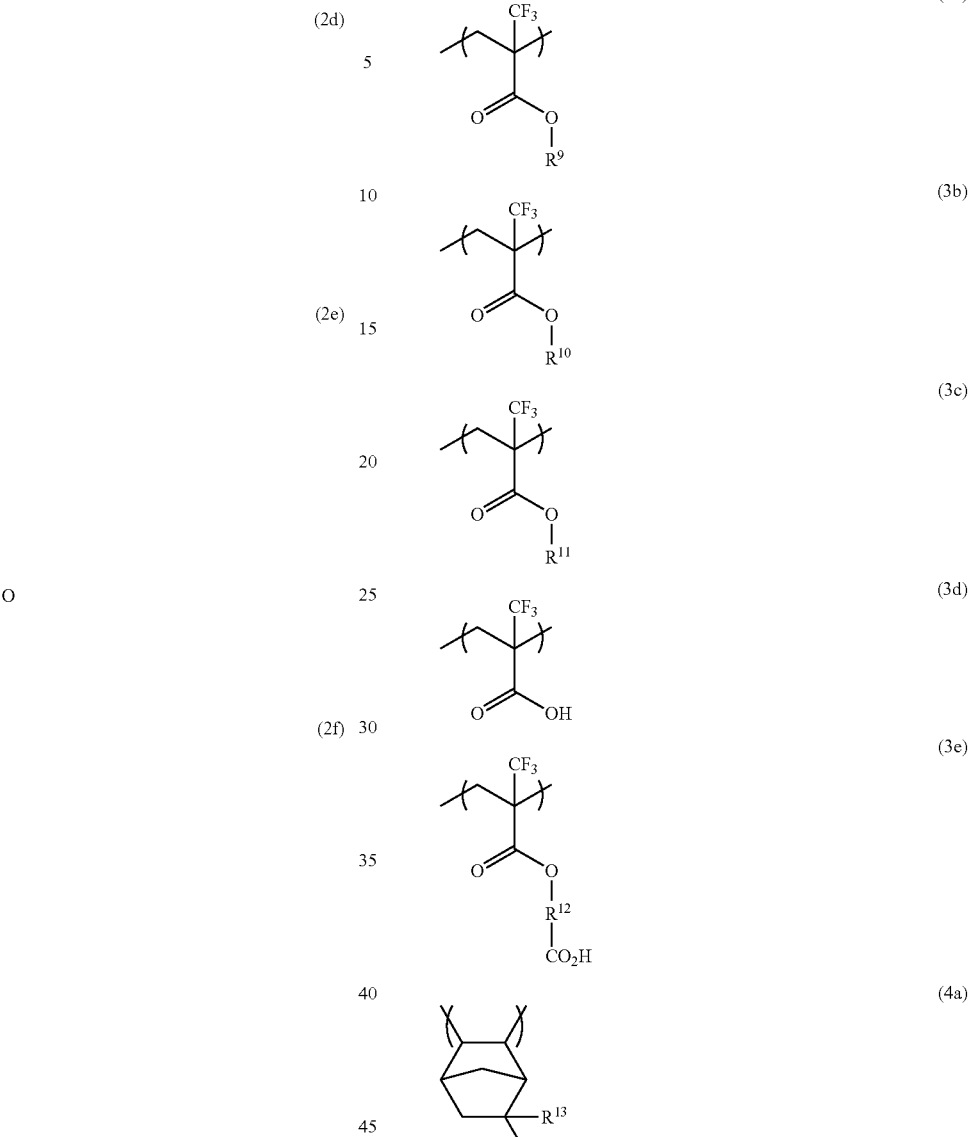

Herein $R^5$ is hydrogen or methyl, $R^{4a}$ and $R^{4b}$ each are hydrogen or a straight, branched or cyclic $C_1$-$C_{15}$ alkyl group, $R^{4a}$ and $R^{4b}$ may bond together to form a $C_3$-$C_8$ non-aromatic ring with the carbon atom to which they are attached, $R^5$ is hydrogen, a straight, branched or cyclic $C_1$-$C_{15}$ alkyl or fluoroalkyl group, or an acid labile group, $R^{6a}$, $R^{6b}$ and $R^{6c}$ each are hydrogen or a straight, branched or cyclic $C_1$-$C_{15}$ alkyl group, $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ alkyl group, $R^{7b}$ is a straight, branched or cyclic $C_1$-$C_{15}$ alkyl group, $R^{7a}$ and $R^{7b}$ may bond together to form a $C_3$-$C_8$ non-aromatic ring with the carbon atom to which they are attached, and $R^8$ is a straight, branched or cyclic $C_1$-$C_{15}$ fluoroalkyl group.

[5] The resist composition of any one of [1] to [4] wherein the polymer (A) further comprises recurring units of one or multiple types selected from the following general formulae (3a) to (3e), (4a) to (4e), (5a) to (5c), and (6a) to (6c):

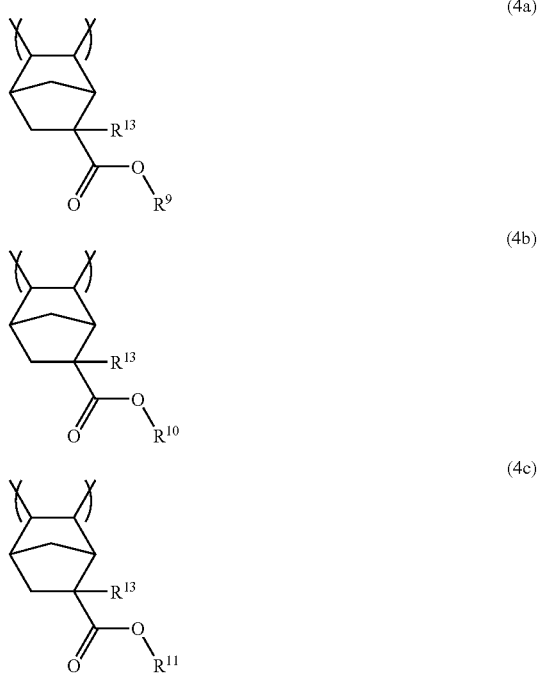

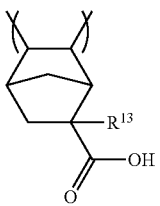
(4d)

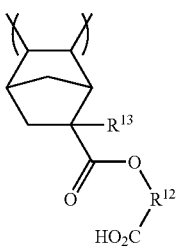
(4e)

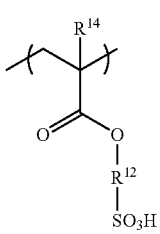
(5a)

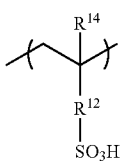
(5b)

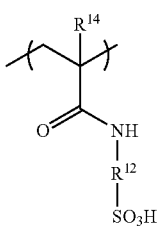
(5c)

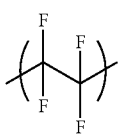
(6a)

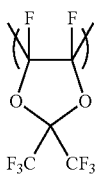
(6b)

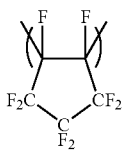
(6c)

wherein $R^9$ is a $C_1$-$C_{15}$ alkyl or fluoroalkyl group, $R^{10}$ is an adhesive group, $R^{11}$ is an acid labile group, $R^{12}$ is a single bond or a divalent $C_1$-$C_{15}$ organic group, $R^{13}$ and $R^{14}$ each are hydrogen, methyl or trifluoromethyl.

[6] The resist composition of any one of [1] to [5] wherein the polymer (B) is selected from the group consisting of (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

[7] The resist composition of any one of [1] to [6] wherein the polymer (A) comprising recurring units of formula (1), (1a), (1') or (1a') is present in an amount of 0.1 to 50 parts by weight per 100 parts by weight of the polymer (B).

[8] The resist composition of any one of [1] to [7], further comprising (E) a basic compound.

[9] The resist composition of any one of [1] to [8], further comprising (F) a dissolution regulator.

[10] A pattern forming process comprising the steps of (1) applying the resist composition of any one of [1] to [9] onto a substrate to form a resist coating, (2) heat treating the resist coating and exposing it to high-energy radiation through a photomask, and (3) developing the exposed coating with a developer.

[11] A pattern forming process comprising the steps of (1) applying the resist composition of any one of [1] to [9] onto a substrate to form a resist coating, (2) heat treating the resist coating and exposing it to high-energy radiation from a projection lens through a photomask while holding a liquid between the substrate and the projection lens, and (3) developing the exposed coating with a developer.

[12] A pattern forming process comprising the steps of (1) applying the resist composition of any one of [1] to [9] onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

[13] The process of [11] or [12] wherein the liquid is water.

[14] The process of any one of [10] to [13] wherein the high-energy radiation has a wavelength in the range of 180 to 250 nm.

[15] A pattern forming process comprising the steps of (1) applying the resist composition of any one of [1] to [9] onto a mask blank to form a resist coating, (2) heat treating and exposing the resist coating in vacuum to electron beam, and (3) developing with a developer.

ADVANTAGEOUS EFFECTS OF INVENTION

The resist composition contains a novel additive polymer comprising recurring units each structured to have a fluorinated ester at the distal end of a side chain within the unit. The additive polymer is highly transparent to radiation with wavelength of up to 200 nm. Various properties of the polymer including water repellency, water slip, fat solubility, acid lability, and hydrolysis may be adjusted by a choice of polymer structure. The polymer can be prepared from reactants which are readily available and easy to handle.

DESCRIPTION OF EMBODIMENTS

The singular forms "a", "an" and "the" include plural references unless the context clearly dictates otherwise.

The notation (Cn-Cm) means a group containing from n to m carbon atoms per group.

Additive Polymer

The polymer used as an additive in the resist composition of the invention is characterized by comprising recurring units having the general formula (1), (1a), (1'), or (1a').

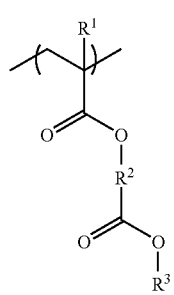
(1)

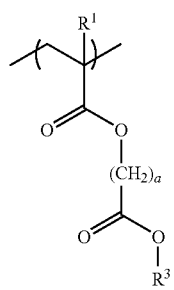
(1a)

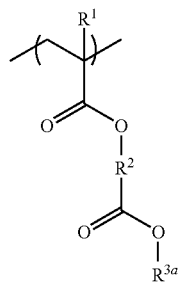
(1')

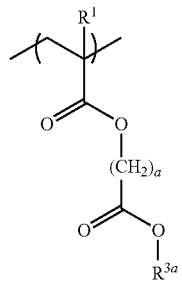
(1a')

Herein R' is hydrogen or methyl. $R^2$ is a straight, branched or cyclic $C_1$-$C_{15}$ alkylene or fluoroalkylene group. $R^3$ is a straight, branched or cyclic $C_1$-$C_{15}$ fluoroalkyl group. $R^{3a}$ is selected from among 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl. The subscript "a" is an integer of 1 to 6.

In formula (1), $R^2$ stands for a straight, branched or cyclic $C_1$-$C_{15}$ alkylene group. Preferred examples of the alkylene group include those forms of alkyl groups with one hydrogen atom eliminated therefrom, the alkyl groups including methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^2$ also stands for a straight, branched or cyclic fluoroalkylene group, typical examples of which include substituted forms of the foregoing alkylene groups in which some or all hydrogen atoms are substituted by fluorine atoms.

$R^3$ stands for a straight, branched or cyclic $C_1$-$C_{15}$ fluoroalkyl group, typical examples of which include, but are not limited to, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl, as represented by $R^{3a}$.

In the polymer used as an additive in the resist composition, the recurring units of formula (1), (1a), (1') or (1a') contribute to water repellency and water slip since they contains fluorine. In these recurring units, the distal ester bond is an ester of a hydroxyl group of a high acidity fluoroalcohol with carboxylic acid, which is a so-called mixed acid anhydride, and is thus more susceptible to alkaline hydrolysis than the esters of common alcohols with carboxylic acids. Moreover, the ester bond of main chain (meth)acrylate is located in proximity to the distal ester bond, and the main chain ester bond functions to promote alkaline hydrolysis of the distal ester bond. The recurring units of formula (1), (1a), (1') or (1a') are more susceptible to alkaline hydrolysis than (meth)acrylic acid esters of fluoroalcohols. It is thus believed that these recurring units are readily hydrolyzable in alkaline water, for example, an alkaline developer. The addition of a polymer comprising these recurring units as an additive to a resist composition is successful in substantially reducing the contact angle of the resist film after development and eventually suppressing the occurrence of blob defects. It is noted that the polymer comprising recurring units of formula (1), (1a), (1') or (1a') allows for easy structural control by a choice of the carbon count, branching degree, and fluorine count of $R^2$ and $R^3$. The polymer may be prepared so as to meet an appropriate level of water repellency, water slip and blob resistance necessary as a resist additive.

Examples of the recurring units of formula (1), (1a), (1') or (1a') are given below, but not limited thereto.

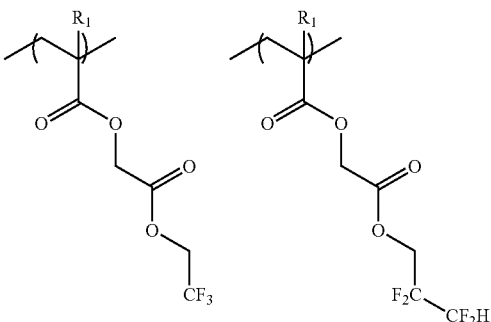

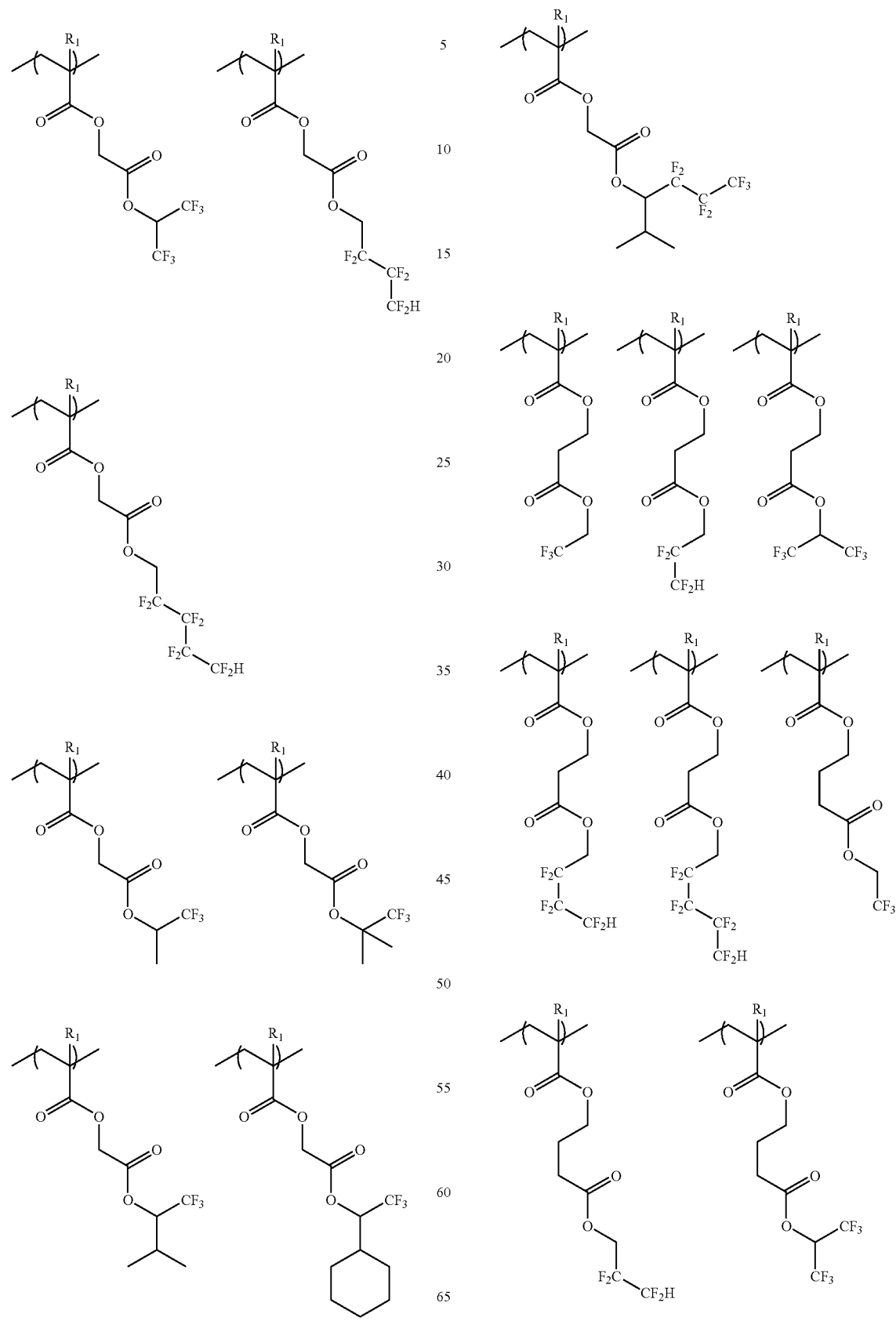

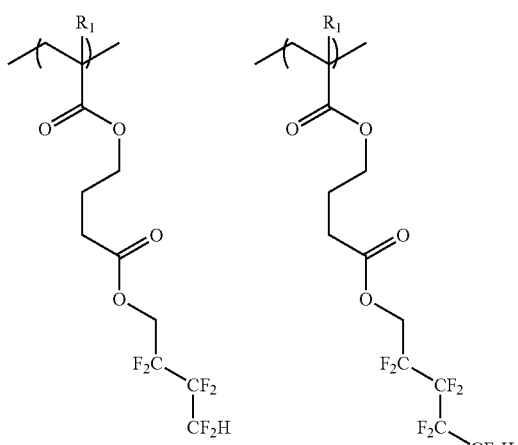
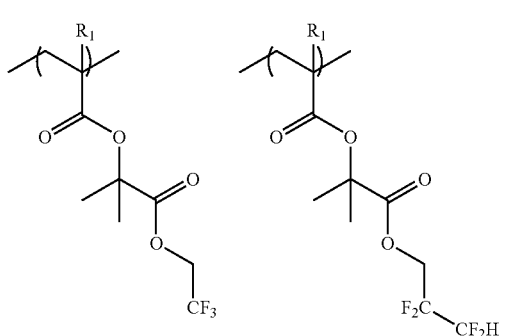
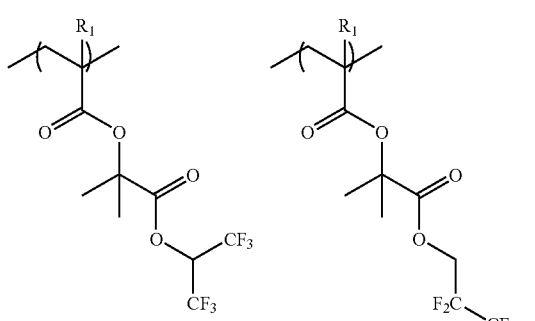
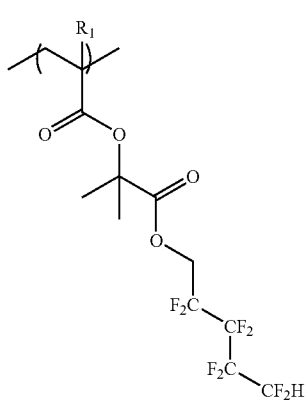

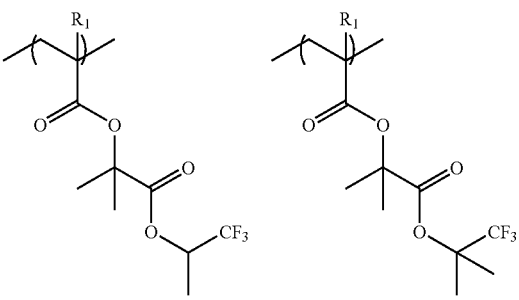
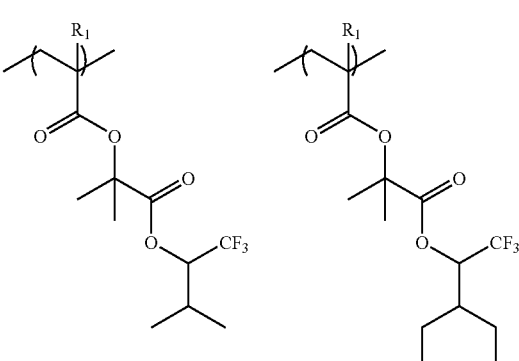
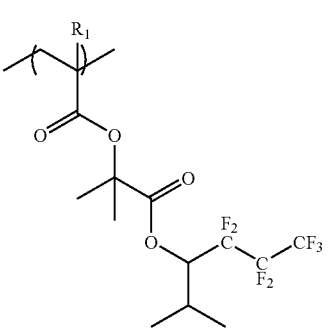

Herein $R^1$ is as defined above.

In addition to the recurring units of formula (1), (1a), (1') or (1a'), the additive polymer may further comprise recurring units of one or multiple types selected from the general formulae (2a) to (2f). The polymer having additional recurring units incorporated herein is more improved in water repellency, water slip, alkaline dissolution, and contact angle after development.

(2a)

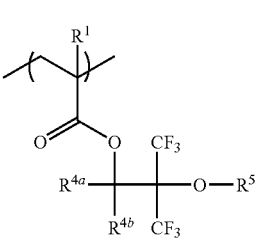

-continued (2b)
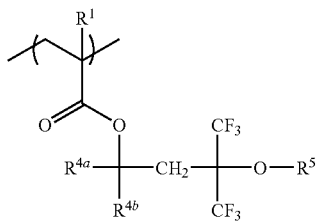

(2c)
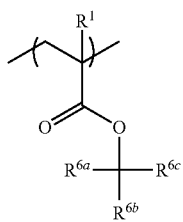

(2d)
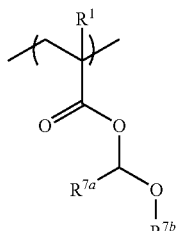

(2e)
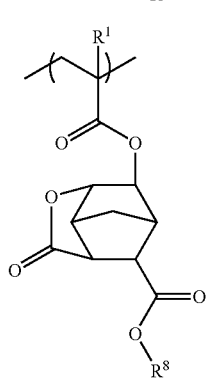

(2f)
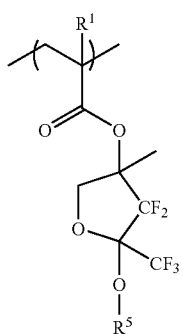

Herein $R^1$ is hydrogen or methyl. $R^{4a}$ and $R^{4b}$ each are hydrogen or a straight, branched or cyclic $C_1$-$C_{15}$ alkyl group, or $R^{4a}$ and $R^{4b}$ may bond together to form a $C_3$-$C_8$ non-aromatic ring with the carbon atom to which they are attached. $R^5$ is hydrogen, a straight, branched or cyclic $C_1$-$C_{15}$ alkyl or fluoroalkyl group, or an acid labile group. $R^{6a}$, $R^{6b}$ and $R^{6c}$ each are hydrogen or a straight, branched or cyclic $C_1$-$C_{15}$ alkyl group, or $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached. $R^{7a}$ is hydrogen or a straight, branched or cyclic $C_1$-$C_{15}$ alkyl group, $R^{7b}$ is a straight, branched or cyclic $C_1$-$C_{15}$ alkyl group, or $R^{7a}$ and $R^{7b}$ may bond together to form a $C_3$-$C_8$ non-aromatic ring with the carbon atom to which they are attached. $R^8$ is a straight, branched or cyclic $C_1$-$C_{15}$ fluoroalkyl group.

With respect to $R^{4a}$, $R^{4b}$, $R^5$, $R^{6a}$, $R^{6b}$, $R^{6c}$, $R^{7a}$ and $R^{7b}$, examples of the straight, branched or cyclic $C_1$-$C_{15}$ alkyl group include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

A pair of $R^{4a}$ and $R^{4b}$, $R^{6a}$ and $R^{6b}$, $R^{6a}$ and $R^{6c}$, $R^{6b}$ and $R^{6c}$, or $R^{7a}$ and $R^{7b}$ may bond together to form a $C_3$-$C_8$ non-aromatic ring with the carbon atom to which they are attached. In the event of cyclization, each R is an alkylene group corresponding to the foregoing alkyl groups with one hydrogen atom eliminated therefrom, and exemplary rings are cyclopentyl and cyclohexyl.

$R^5$ and $R^8$ also stand for straight, branched or cyclic $C_1$-$C_{15}$ fluoroalkyl groups which are typically substituted forms of the foregoing alkyl groups in which some or all hydrogen atoms are substituted by fluorine atoms. Examples include, but are not limited to, trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl.

The acid labile group represented by $R^5$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1)

(L2)

(L3)

(L4)

Herein $R^{L01}$ and $R^{L02}$ are hydrogen or straight, branched or cyclic alkyl groups of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Alternatively, two of $R^{L07}$ to $R^{L16}$ may bond together to form a non-aromatic ring with the carbon atom(s) to which they are attached, or two of $R^{L07}$ to $R^{L16}$ which are attached to vicinal carbon atoms may bond together directly to form a double bond. Letter y is an integer of 0 to 6, m is equal to 0 or 1, n is equal to 0, 1, 2 or 3, and 2m+n is equal to 2 or 3. The broken line denotes a valence bond.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

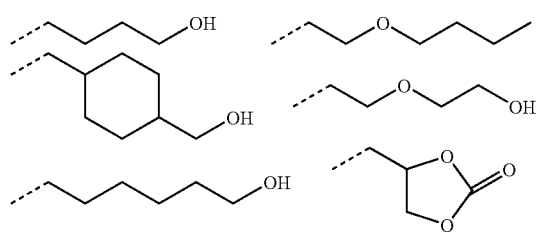

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted $C_1$-$C_{10}$ alkyl groups of $R^{L05}$ include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted $C_6$-$C_{20}$ aryl groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary monovalent hydrocarbon groups of $R^{L07}$ to $R^{L16}$ are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a non-aromatic ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

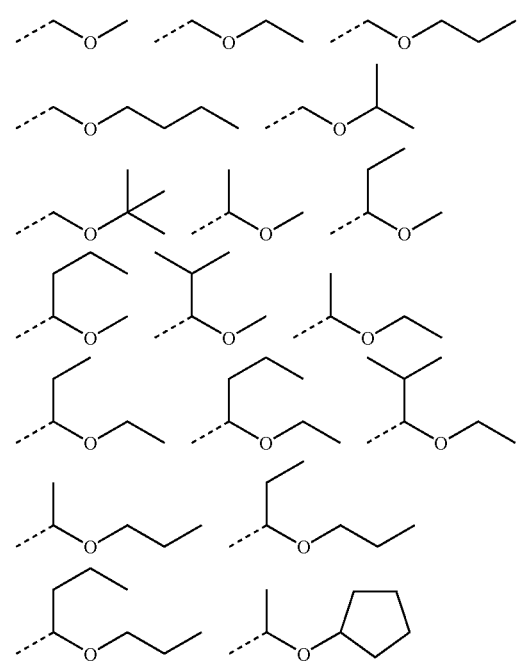

-continued

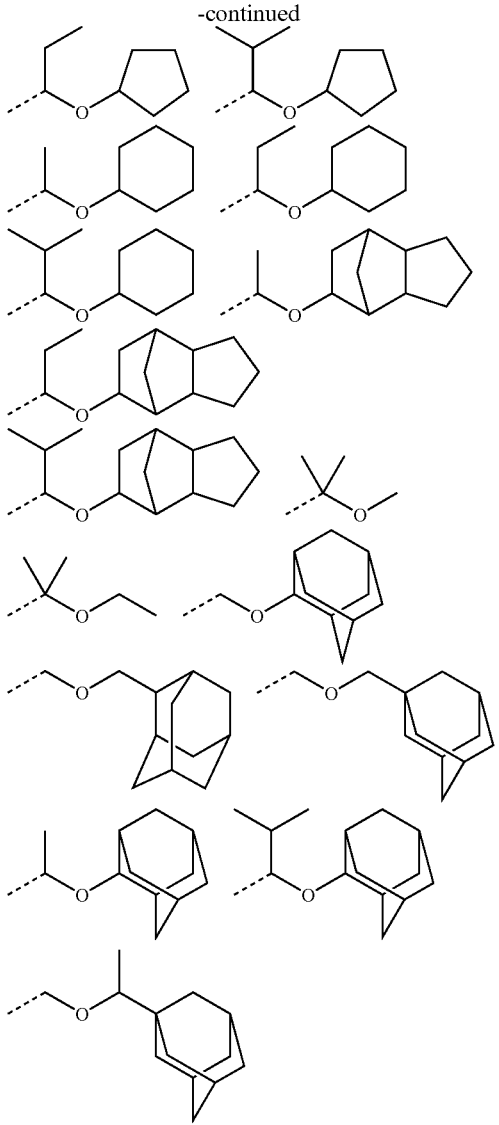

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

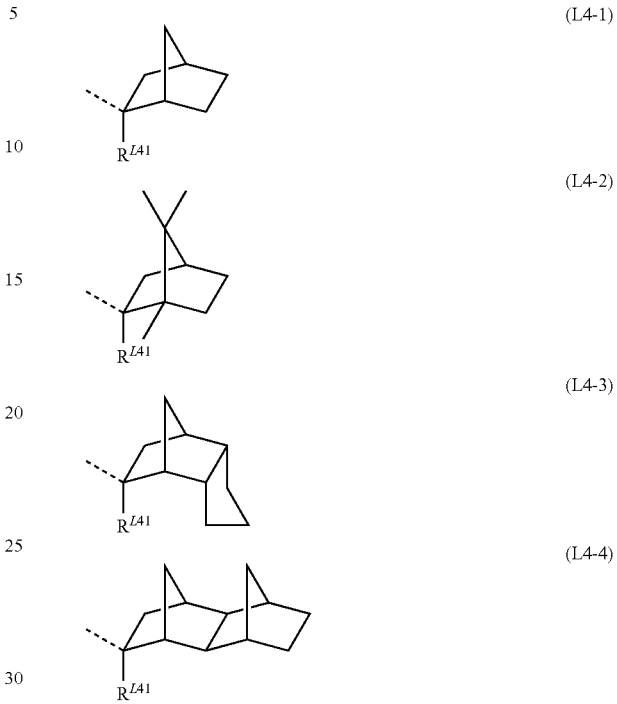

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

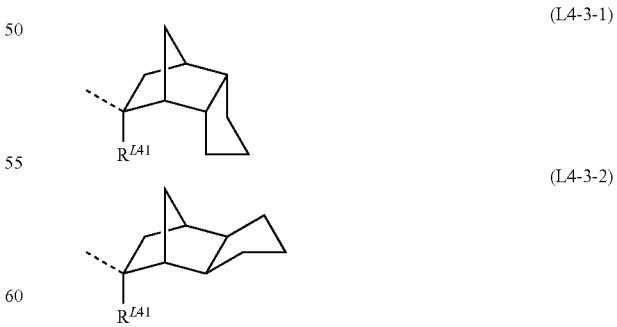

Note that $R^{L41}$ is as defined above.

Similarly, the general formula (L4-4) represents one or a mixture of two or more selected from groups having the following general formulas (L4-4-1) to (L4-4-4).

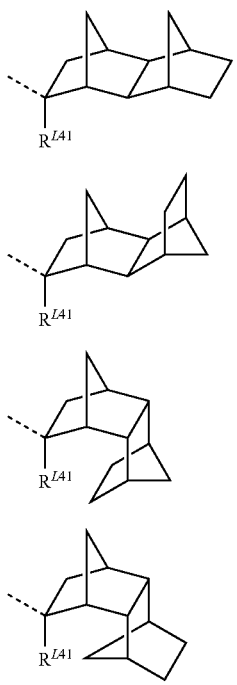

(L4-4-1)

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

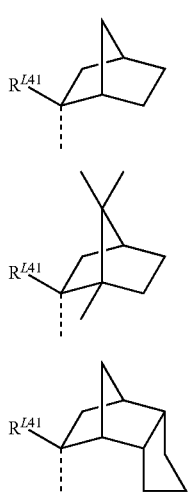

(L4-1-endo)

(L4-2-endo)

(L4-3-endo)

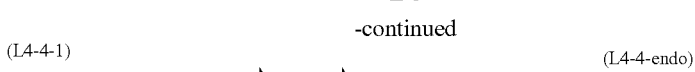

(L4-4-endo)

Note that $R^{L41}$ is as defined above.

Illustrative examples of the acid labile group of formula (L4) are given below.

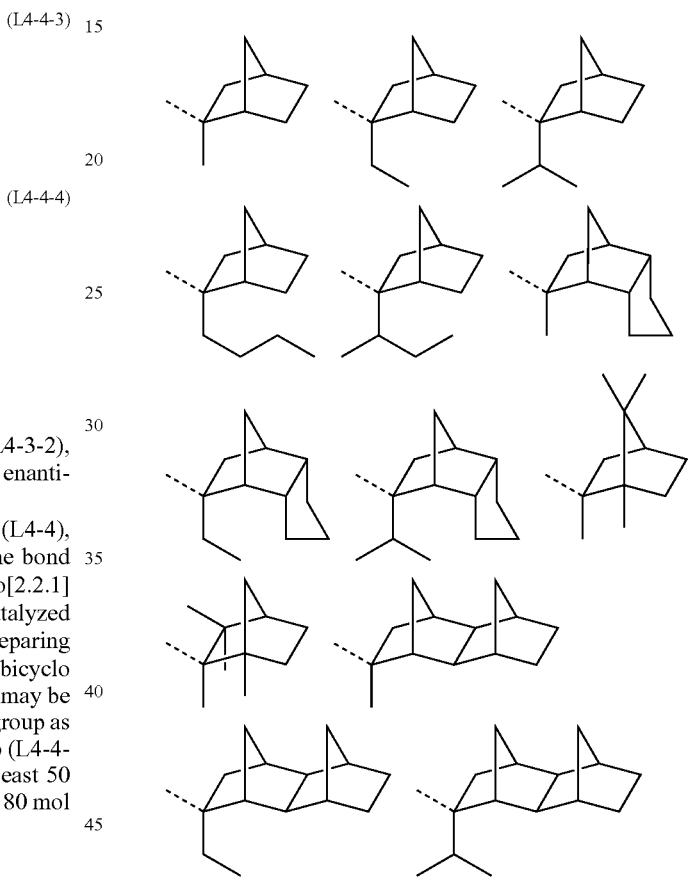

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^5$, are as exemplified for $R^{L04}$ and the like.

Illustrative examples of the recurring units having formulae (2a) to (2f) are given below, but not limited thereto.

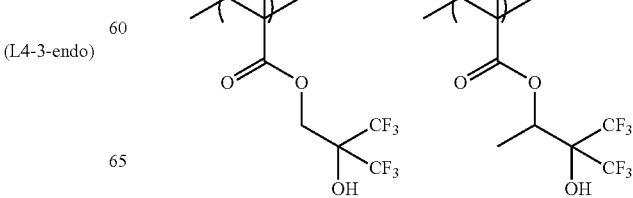

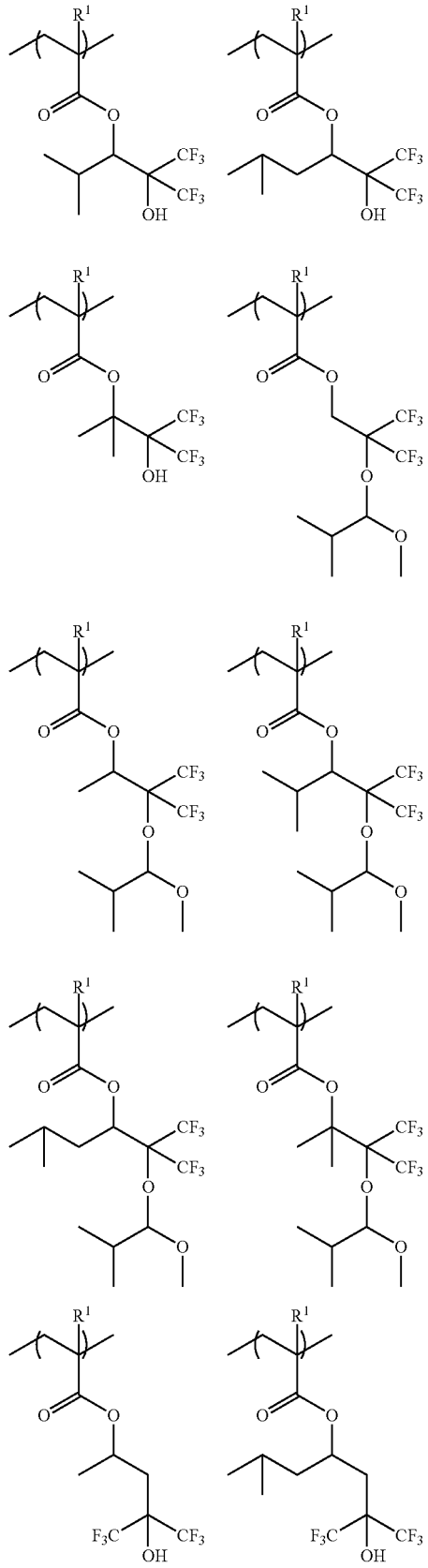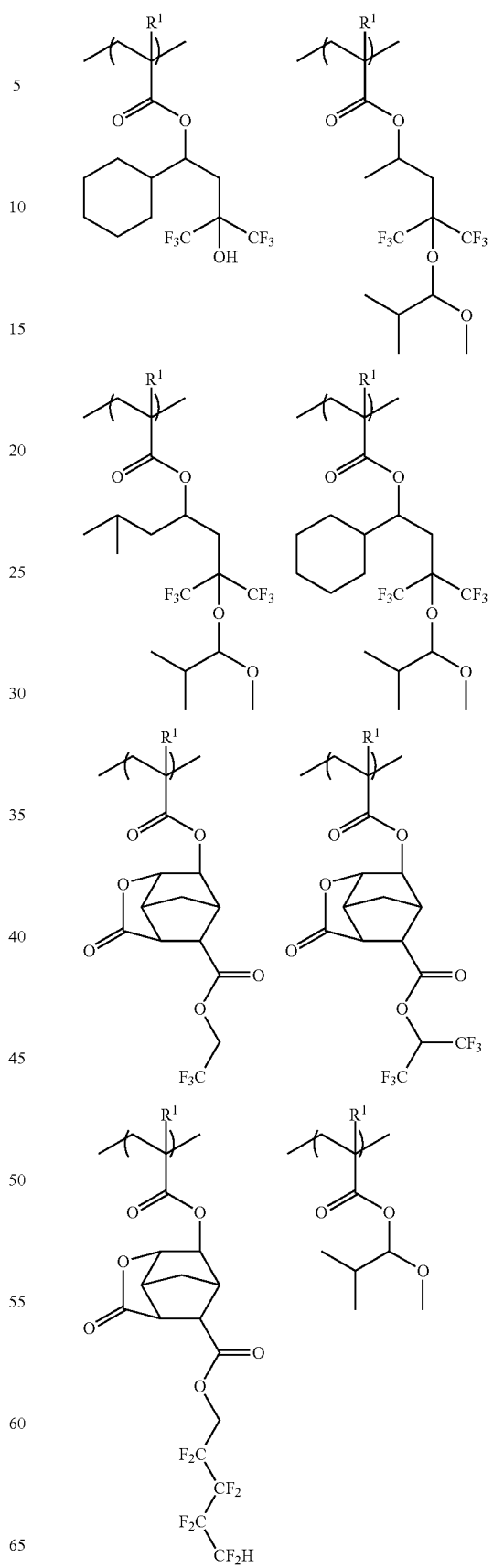

-continued

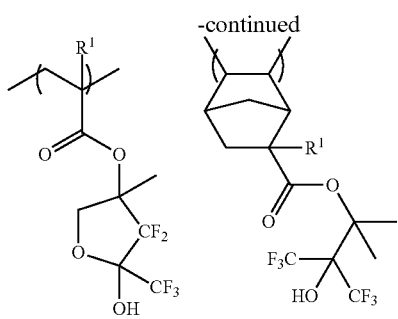
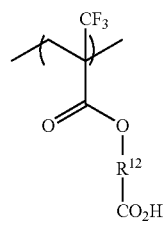
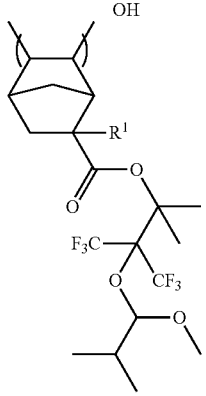

Note that $R^1$ is as defined above.

Although the polymer comprising recurring units of formula (1), (1a), (1') or (1a') in combination with recurring units of formulae (2a) to (2f) exerts satisfactory performance as the resist additive, recurring units of one or multiple types selected from formulae (3a) to (3e), (4a) to (4e), (5a) to (5c), and (6a) to (6c) may be further incorporated therein for the purposes of imparting further water repellency and water slip, and controlling alkaline solubility and developer affinity.

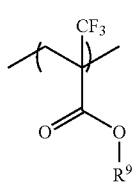 (3a)

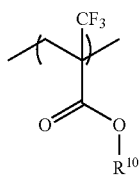 (3b)

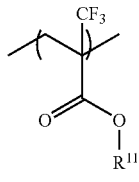 (3c)

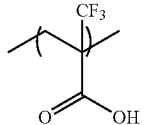 (3d)

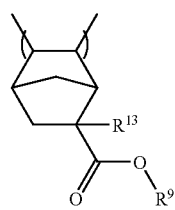 (3e)

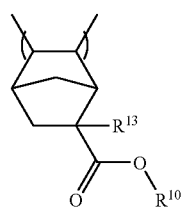 (4a)

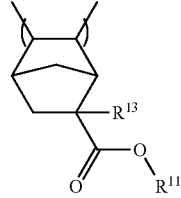 (4b)

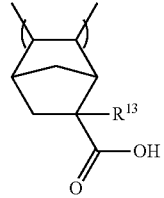 (4c)

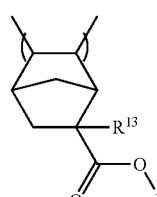 (4d)

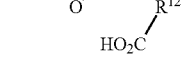 (4e)

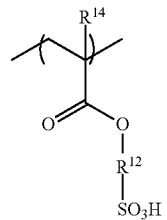 (5a)

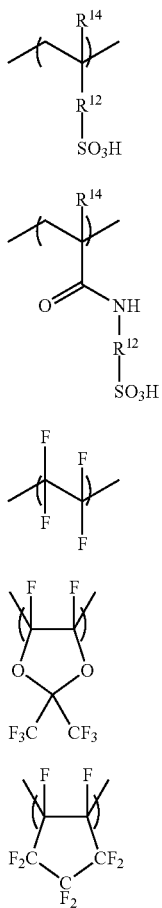

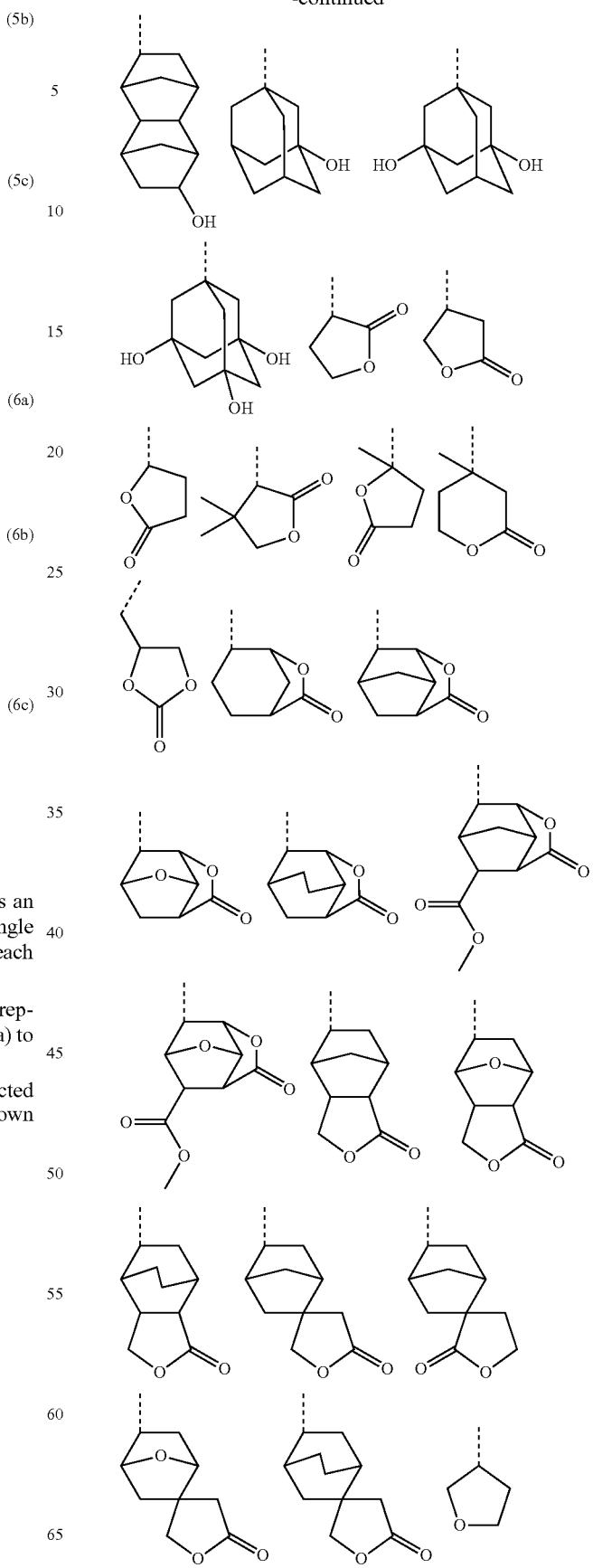

Herein $R^9$ is a $C_1$-$C_{15}$ alkyl or fluoroalkyl group, $R^{10}$ is an adhesive group, $R^{11}$ is an acid labile group, $R^{12}$ is a single bond or divalent $C_1$-$C_{15}$ organic group, and $R^{13}$ and $R^{14}$ each are hydrogen, methyl or trifluoromethyl.

Examples of the $C_1$-$C_{15}$ alkyl and fluoroalkyl groups represented by $R^9$ are the same as illustrated in formulae (2a) to (2f).

The adhesive group represented by $R^{10}$ may be selected from a variety of such groups, typically those groups shown below.

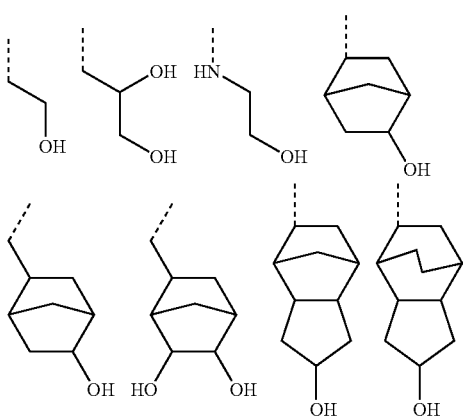

-continued

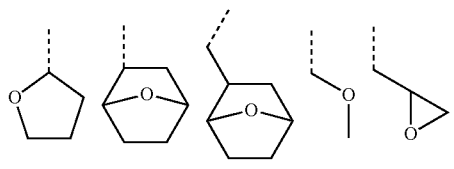
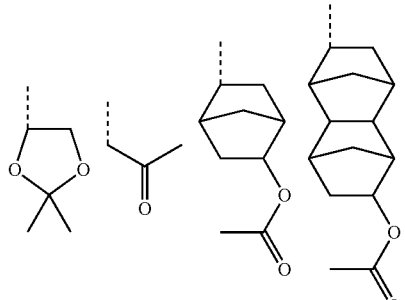
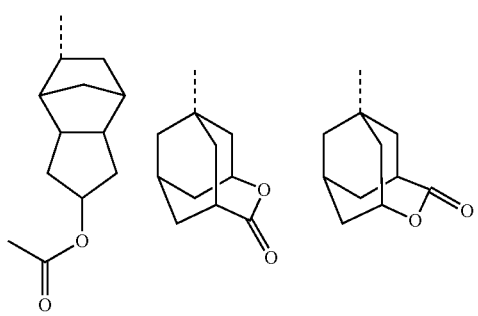
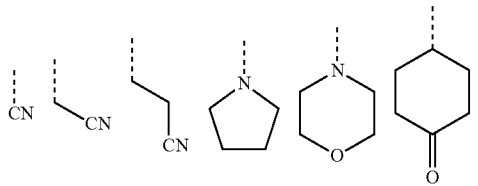
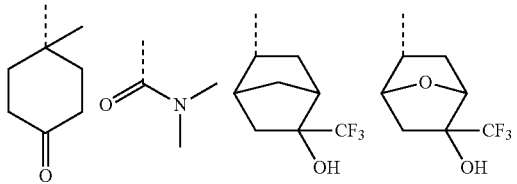
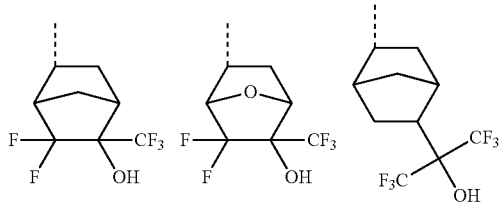
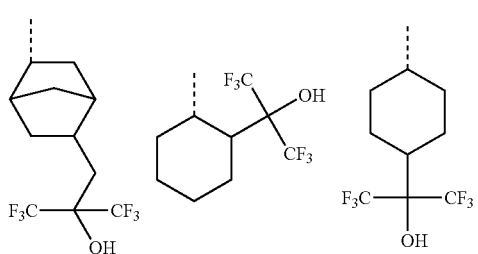

-continued

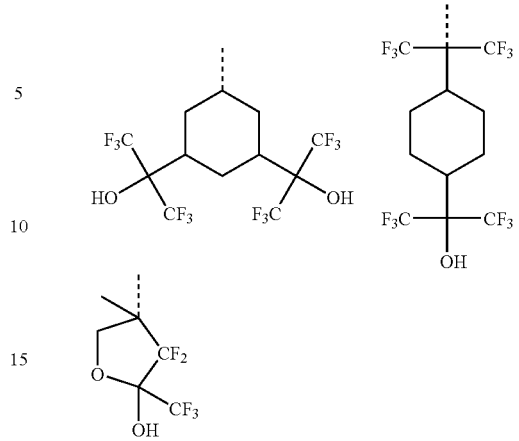

Herein, the broken line designates a valence bond.

The acid labile group represented by $R^{11}$ may be selected from those groups illustrated for $R^5$.

Suitable divalent $C_1$-$C_{15}$ organic groups represented by $R^{12}$ include alkyl groups as exemplified for $R^2$ in formula (1) or (1'), with one hydrogen atom eliminated (e.g., methylene and ethylene). Also useful are groups of the following formulae.

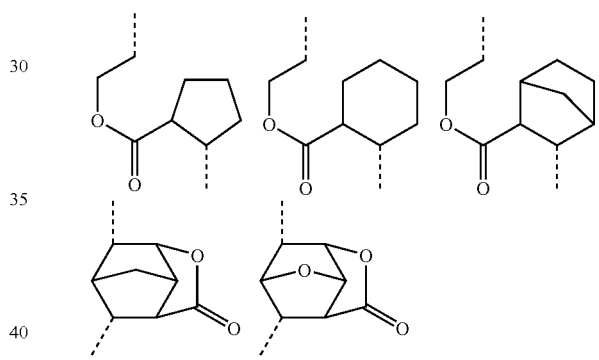

Herein, the broken line designates a valence bond.

Monomer Synthesis

The polymer used as the additive in the resist composition is characterized by comprising essentially recurring units having formula (1), (1a), (1') or (1a'). Monomers from which these recurring units are derived may be synthesized by any well-known methods, for example, the method of US 2006269871 (JP-A 2006-328259), as illustrated by the following reaction scheme, although the method is not limited thereto.

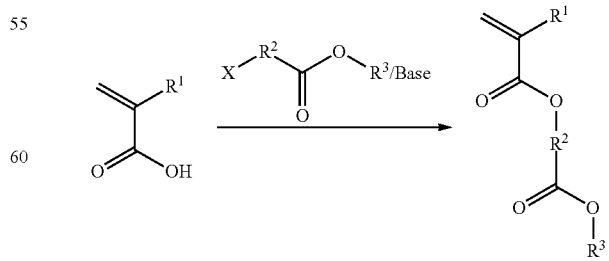

Herein $R^1$, $R^2$, and $R^3$ are as defined above, and X is chlorine, bromine or iodine.

In this exemplary reaction scheme, acrylic or methacrylic acid is reacted with $X-R^2-CO_2R^3$ in the presence of a base. Examples of the base used herein include potassium carbonate, sodium carbonate, sodium hydride, sodium methoxide, sodium ethoxide, potassium t-butoxide, triethylamine, 4-dimethylaminopyridine and the like. The amount of the base used, which depends on its structure, is usually in the range of 1 to 10 moles, preferably 1 to 3 moles per mole of the acrylic acid.

Examples of suitable solvents which can be used as the reaction medium include hydrocarbons such as n-hexane, n-heptane, benzene, toluene, xylene and cumene; ethers such as tetrahydrofuran, diethyl ether, di-n-butyl ether, and 1,4-dioxane; dimethylsulfoxide (DMSO), N,N-dimethylformamide (DMF), and acetonitrile, which may be used alone or in admixture.

An appropriate reaction temperature may be selected depending on other reaction conditions, although the reaction is generally performed at room temperature or under water cooling. It is desired for higher yields that the reaction time is determined by monitoring the course of reaction by thin-layer chromatography (TLC) or gas chromatography (GC). The reaction time is usually about 0.1 hour to about 240 hours.

After the completion of reaction, the target polymerizable ester compound is recovered from the reaction mixture by a conventional post-treatment such as aqueous work-up or concentration. If necessary, the ester compound can be purified by any conventional technique such as recrystallization, chromatography or distillation.

Polymer Synthesis

For convenience of description, the polymer comprising recurring units of formula (1), (1a), (1') or (1a') and optionally recurring units of at least one type selected from formulae (2a) to (2f) is referred to as polymer P1, hereinafter.

The polymer P1 may be synthesized by general polymerization processes including radical polymerization using initiators such as 2,2'-azobisisobutyronitrile (AIBN), and ionic (or anionic) polymerization using alkyllithium or the like. The polymerization may be carried out by its standard technique. Preferably the polymer P1 is synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of polymer P1, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Polymer P1 may be synthesized by combining suitable monomers selected from polymerizable monomers corresponding to recurring units of formulae (1), (1a), (1') or (1a'), (2a) to (2f), (3a) to (3e), (4a) to (4e), (5a) to (5c), and (6a) to (6c), adding an initiator and chain transfer agent to the monomer mixture, and effecting polymerization.

In polymer P1 wherein U1 stands for a total molar number of a monomer corresponding to units of formula (1), (1a), (1') or (1a'), U2 stands for a total molar number of monomers corresponding to units of formulae (2a) to (2f), and U3 stands for a total molar number of monomers corresponding to units of formulae (3a) to (3e), (4a) to (4e), (5a) to (5c), and (6a) to (6c), with the proviso that U1+U2+U3=U(=100 mol %), values of U1, U2, and U3 are preferably determined so as to meet:

$0 \leq U1/U < 1$, more preferably $0.1 \leq U1/U \leq 0.7$, even more preferably $0.1 \leq U1/U \leq 0.6$, $0 \leq U2/U < 1$, more preferably $0.3 \leq U2/U \leq 0.9$, even more preferably $0.3 \leq U2/U \leq 0.8$, and $0 \leq U3/U < 1$, more preferably $0 \leq U3/U \leq 0.4$, even more preferably $0 \leq U3/U \leq 0.2$.

For polymerization, a solvent may be used if desired. Preferred is the solvent which does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably polymer P1 has a weight average molecular weight (Mw) of 1,000 to 500,000, and especially 2,000 to 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In polymer P1, $R^5$ in formulae (2a), (2b) and (2f) and $R^{11}$ in formulae (3c) and (4c) may be introduced by post-protection reaction. Specifically, a monomer wherein $R^5$ or $R^{11}$ is hydrogen is previously polymerized to synthesize a precursor polymer. Post-protection reaction is effected on the precursor polymer for substituting acid labile groups $R^5$ or $R^{11}$ for some or all hydroxyl groups on the precursor polymer as shown below.

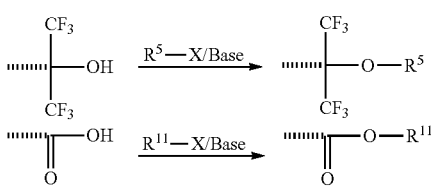

Herein $R^5$, $R^{11}$ and X are as defined above.

The desired polymer is obtainable via post-protection reaction by reacting the precursor polymer with a base in an amount of 1 to 2 equivalents relative to the desired degree of substitution of hydroxyl groups, and then with $R^5$—X or $R^{11}$—X in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

Resist Composition

Briefly stated, the resist composition is defined as comprising (A) polymer P1, (B) a polymer which becomes soluble in an alkaline developer under the action of an acid as a base resin, (C) a compound capable of generating an acid upon exposure to high-energy radiation, and (D) an organic solvent.

Polymer(s) P1 is added as an additive to the resist composition preferably in a total amount of 0.1 to 50 parts, more preferably 0.5 to 10 parts by weight per 100 parts by weight of the base resin (B). At least 0.1 phr of polymer P1 is effective in improving the receding contact angle with water of photoresist film surface, whereas up to 50 phr of polymer P1 forms a photoresist film having a low dissolution rate in alkaline developer and capable of maintaining the height of a fine pattern formed therein.

Since polymer P1 comprises recurring units of formula (1), (1a), (1') or (1a') structured to have a fluorinated ester at the end of a side chain within the unit, a choice of polymer structure makes it possible to tailor any of properties including water repellency, water slip, fat solubility, acid lability, hydrolysis, and alkaline solubility.

When polymer P1 is used in admixture with base resin (B) to form a resist film, layer separation occurs during spin coating such that polymer P1 segregates in a resist film upper layer. The resulting resist film displays improved water repellency and water slip on its surface and prevents water-soluble components from being leached out of the resist material. Since polymer P1 has a structure susceptible to alkaline hydrolysis as mentioned above, it serves to render more hydrophilic the resist film surface after development, eventually suppressing the occurrence of blob defects.

Base Resin

The resist composition contains (B) a base resin or polymer which becomes soluble in an alkaline developer under the action of an acid. Examples of the polymer (B) include, but are not limited to, (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

Specific examples of the polymer (B) are described in U.S. Pat. No. 7,537,880 (JP-A 2008-111103, paragraph [0072] to [0120]). Among others, those polymers comprising units of the general formula (R1) and/or (R2) are preferred.

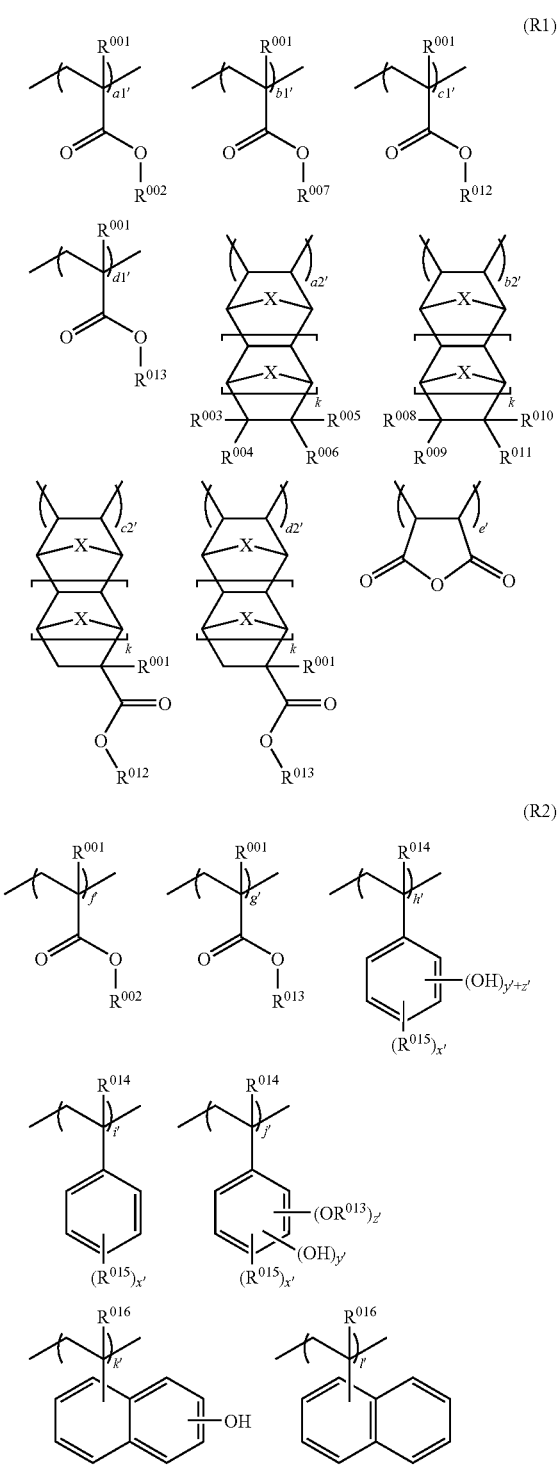

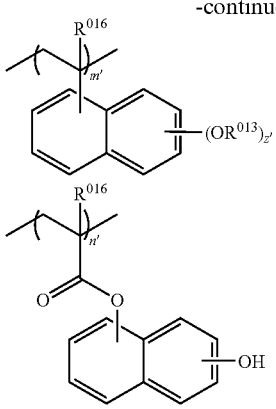

Herein, $R^{001}$ is hydrogen, methyl or trifluoromethyl. $R^{002}$ is hydrogen or a monovalent $C_1$-$C_{15}$ hydrocarbon group containing a fluorinated substituent and/or a carboxyl or hydroxyl group. At least one of $R^{003}$ to $R^{006}$ is a monovalent $C_1$-$C_{15}$ hydrocarbon group containing a fluorinated substituent and/or a carboxyl or hydroxyl group while the remainder are each independently hydrogen or a straight, branched or cyclic $C_1$-$C_{15}$ alkyl group. $R^{007}$ is a monovalent $C_3$-$C_{15}$ hydrocarbon group containing a —$CO_2$— partial structure. At least one of $R^{008}$ to $R^{011}$ is a monovalent $C_2$-$C_{15}$ hydrocarbon group containing a —$CO_2$— partial structure while the remainder are each independently hydrogen or a straight, branched or cyclic $C_1$-$C_{15}$ alkyl group. $R^{012}$ is a polycyclic hydrocarbon group having 7 to 15 carbon atoms or an alkyl group containing such a polycyclic hydrocarbon group. $R^{013}$ is an acid labile group. X is methylene or oxygen atom. $R^{014}$ and $R^{016}$ are hydrogen or methyl. $R^{015}$ is a straight, branched or cyclic $C_1$-$C_8$ alkyl group. The subscript k is 0 or 1. In formula (R1), a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', j', k', m', and n' are numbers from 0 to less than 1, satisfying f'+g'+h'+i'+j'+k'+l'+m'+n'=1; x', y' and z' are each an integer of 0 to 3, satisfying $1 \leq x'+y'+z' \leq 5$ and $1 \leq y'+z' \leq 3$.

Examples of the hydrocarbon group represented by R002 include carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

Of the groups represented by $R^{003}$ to $R^{006}$, examples of the monovalent $C_1$-$C_{15}$ hydrocarbon group containing a fluorinated substituent and/or a carboxyl or hydroxyl group include carboxyl, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl;

and examples of the straight, branched or cyclic $C_1$-$C_{15}$ alkyl group include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

Two of $R^{003}$ to $R^{006}$ (for example, a pair of $R^{003}$ and $R^{034}$, or $R^{004}$ and $R^{005}$) may bond together to form a ring with the carbon atom(s) to which they are attached, and in that event, at least one of ring-forming $R^{003}$ to $R^{006}$ is a divalent $C_1$-$C_{15}$ hydrocarbon group having a fluorinated substituent and/or a carboxyl or hydroxyl group, while the remainder are each independently a single bond or a straight, branched or cyclic $C_1$-$C_{15}$ alkylene group. Suitable divalent $C_1$-$C_{15}$ hydrocarbon groups having a fluorinated substituent and/or a carboxyl or hydroxyl group include those exemplified above as the monovalent hydrocarbon groups having a fluorinated substituent and/or a carboxyl or hydroxyl group, with one hydrogen atom eliminated therefrom. Suitable straight, branched or cyclic $C_1$-$C_{15}$ alkylene groups include those alkyl groups exemplified above, with one hydrogen atom eliminated therefrom.

Examples of the monovalent $C_3$-$C_{15}$ hydrocarbon group containing a —$CO_2$— partial structure represented by $R^{007}$ include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

Examples of the monovalent $C_2$-$C_{15}$ hydrocarbon group containing a —$CO_2$— partial structure represented by $R^{008}$ to $R^{011}$ include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups include those exemplified above for $R^{003}$ to $R^{006}$. Two of $R^{008}$ to $R^{011}$ (for example, a pair of $R^{008}$ and $R^{009}$, or $R^{009}$ and $R^{010}$) may bond together to form a ring with the carbon atom(s) to which they are attached, and in that event, at least one of ring-forming $R^{008}$ to $R^{011}$ is a divalent $C_1$-$C_{15}$ hydrocarbon group containing a —$CO_2$— partial structure, while the remainder are each independently a single bond or a straight, branched or cyclic alkylene group. Examples of divalent $C_1$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl as well as those groups exemplified above as the monovalent hydrocarbon group containing a —$CO_2$— partial structure, with one hydrogen atom eliminated therefrom. Suitable straight, branched or cyclic $C_1$-$C_{15}$ alkylene groups include those alkyl groups exemplified above for $R^{003}$ to $R^{006}$, with one hydrogen atom eliminated therefrom.

Examples of the $C_7$-$C_{15}$ polycyclic hydrocarbon group or alkyl group containing such a polycyclic hydrocarbon group represented by $R^{012}$ include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

The acid labile group represented by $R^{015}$ may be selected from a variety of such groups. Examples of the acid labile group are groups of the general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms, which are described and exemplified above.

The polymers having formulae (R1) and (R2) may have further copolymerized therein any of indene, norbornadiene, acenaphthylene, and vinyl ether derivatives.

Examples of the recurring units incorporated at compositional ratio a1' in formula (R1) are shown below, but not limited thereto.

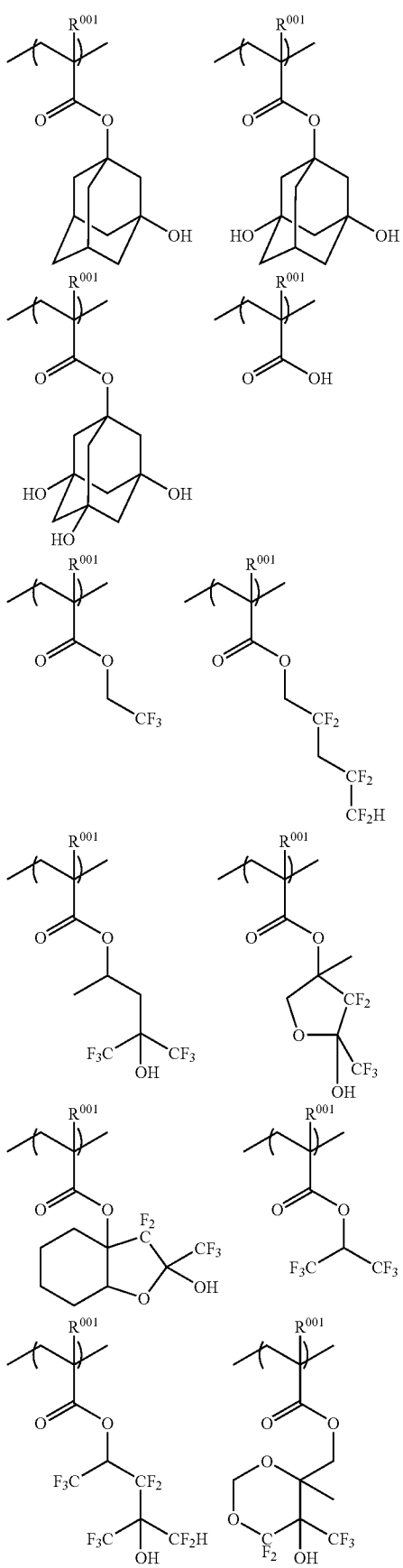
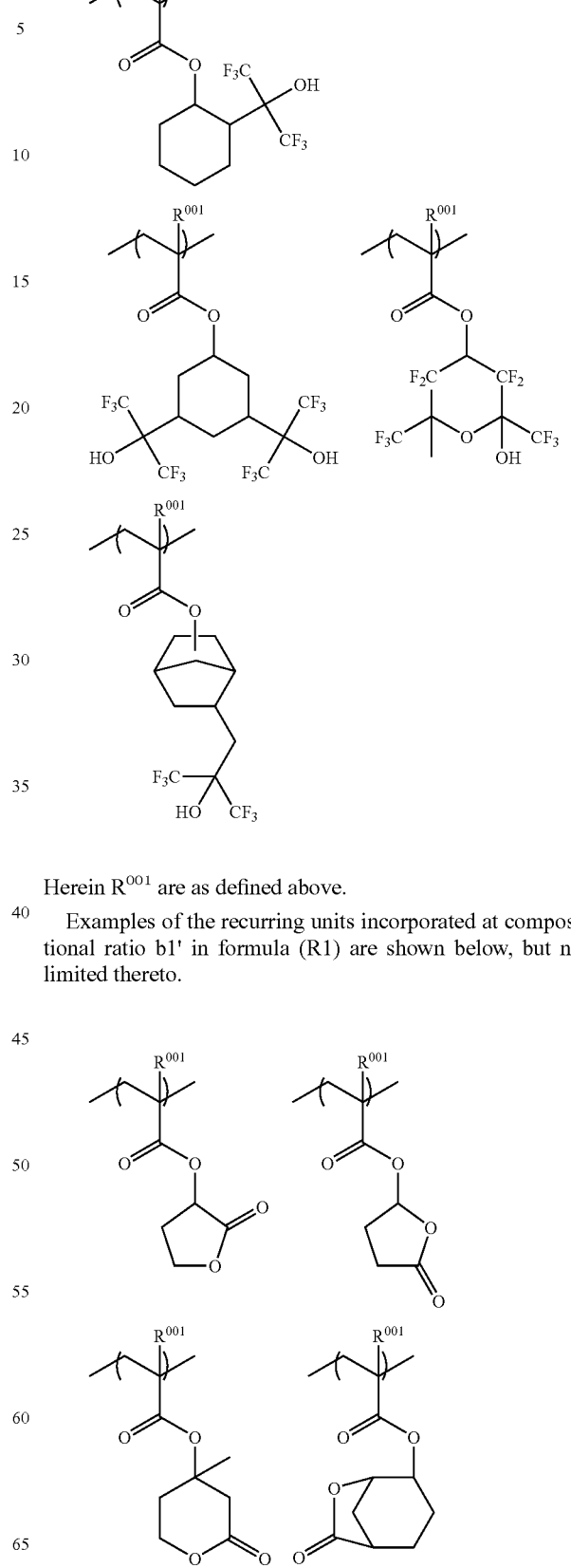
Herein R$^{001}$ are as defined above.
Examples of the recurring units incorporated at compositional ratio b1' in formula (R1) are shown below, but not limited thereto.

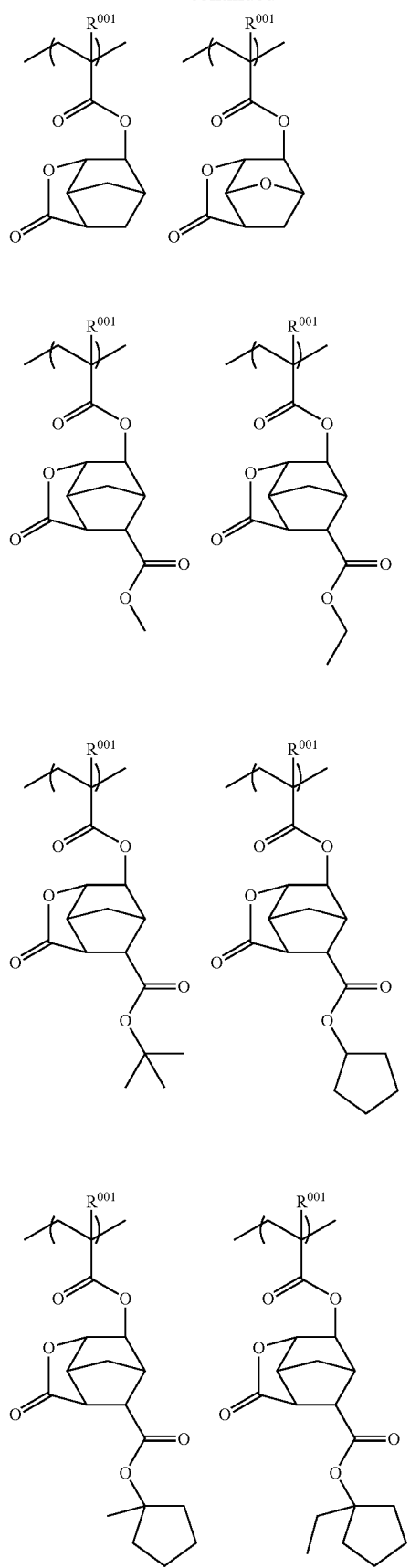
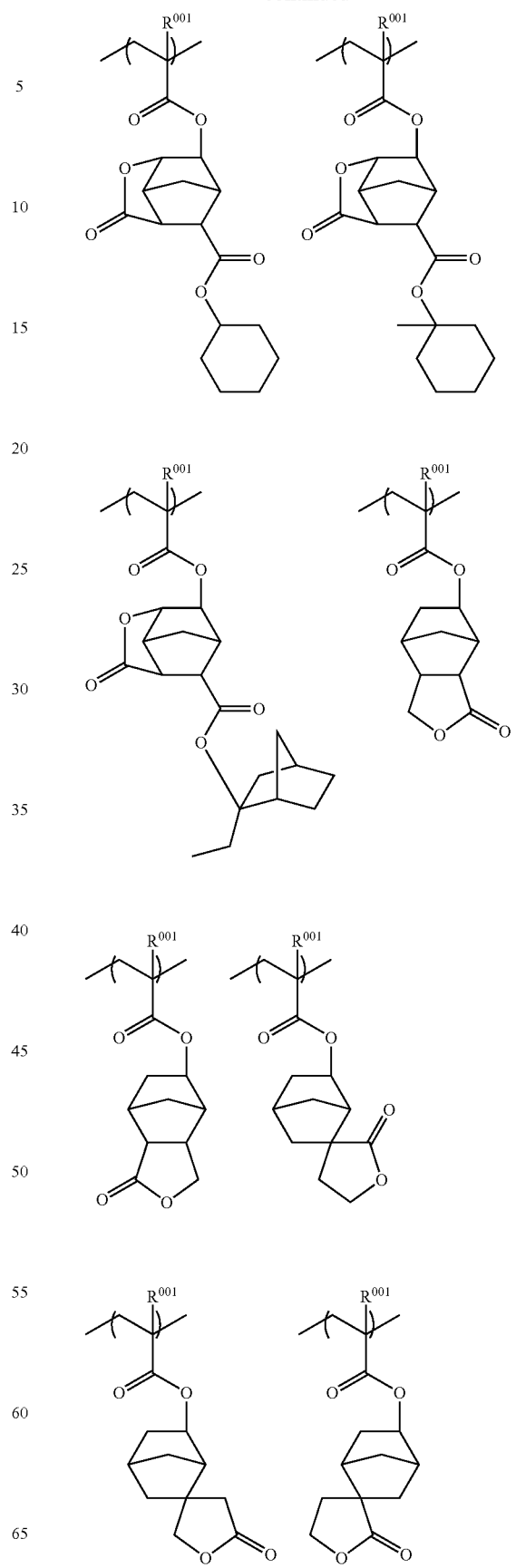

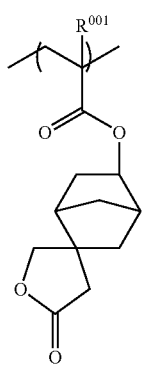
Herein R$^{001}$ are as defined above.
Examples of the recurring units incorporated at compositional ratio d1' in formula (R1) are shown below, but not limited thereto.
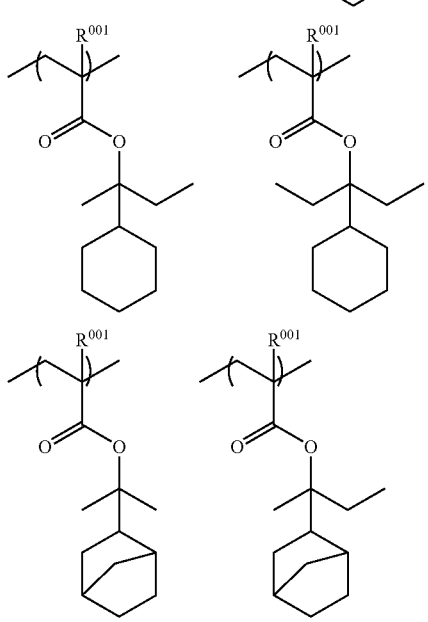
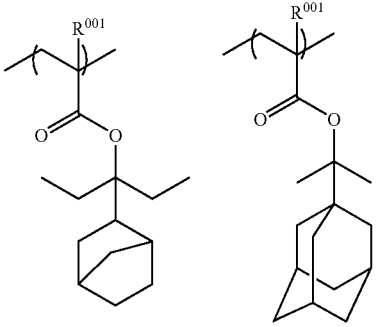
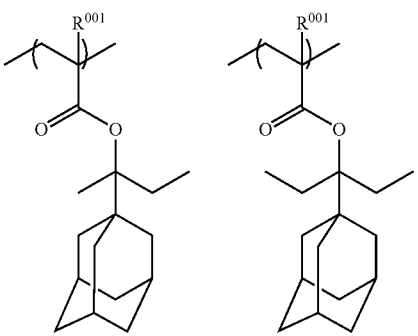
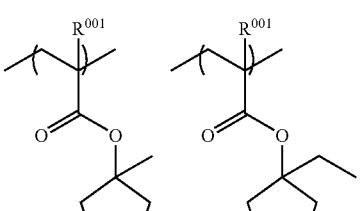
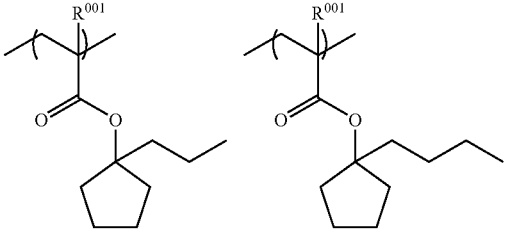
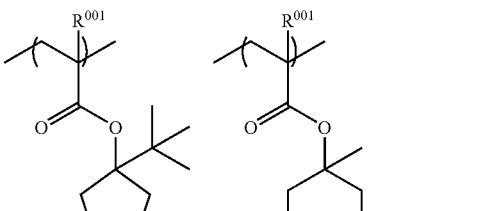
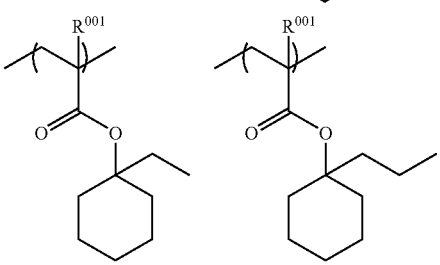

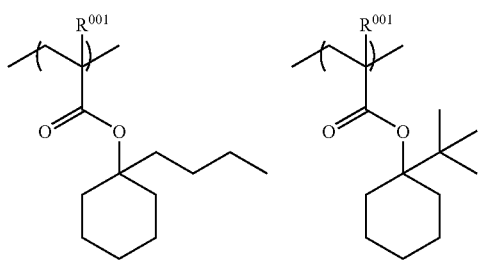
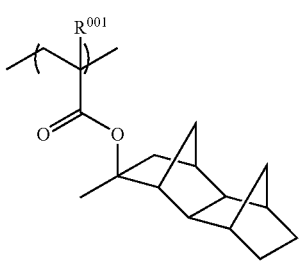
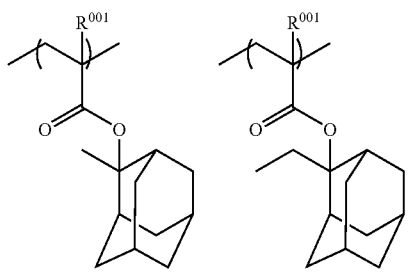
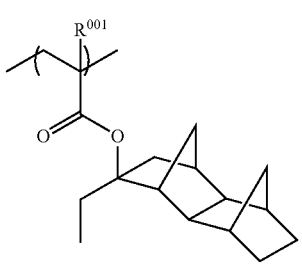
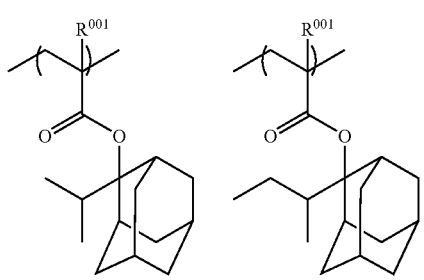
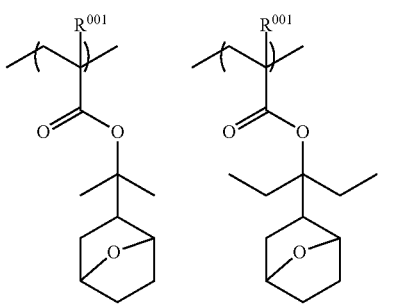
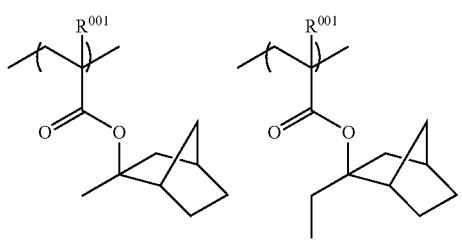
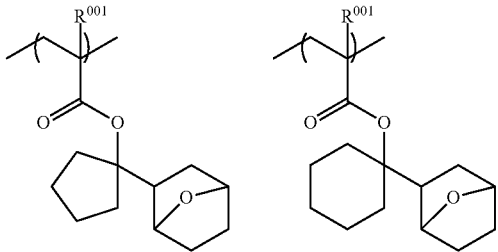
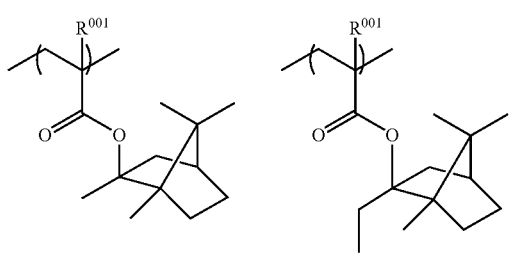
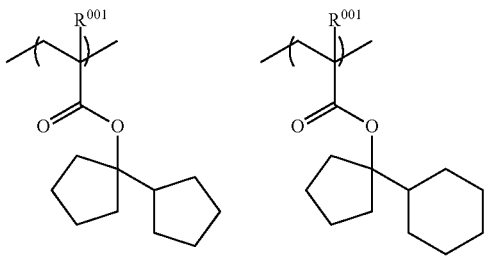
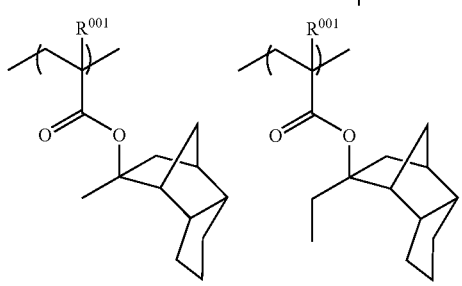
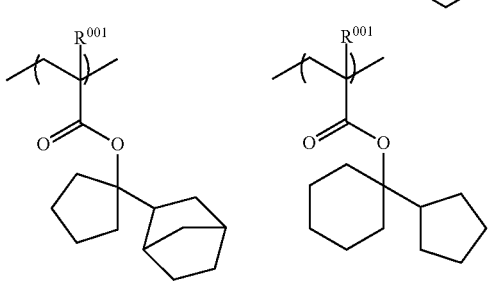

-continued
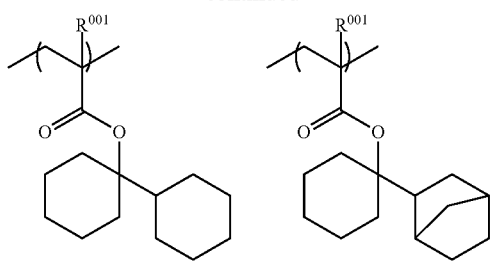
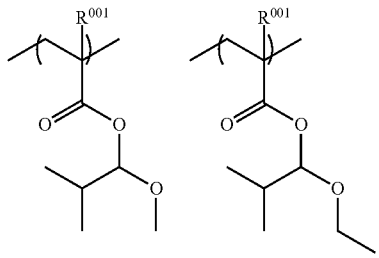
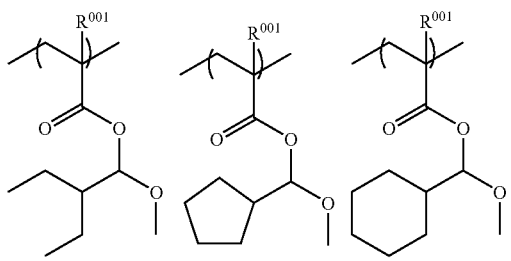
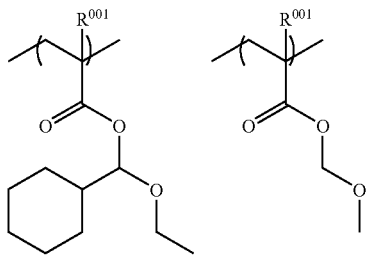
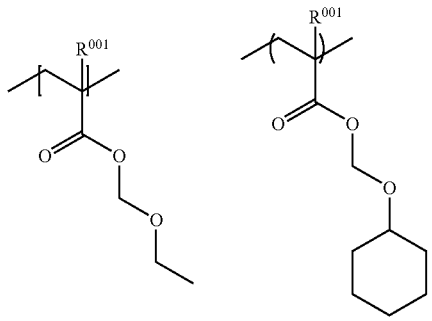
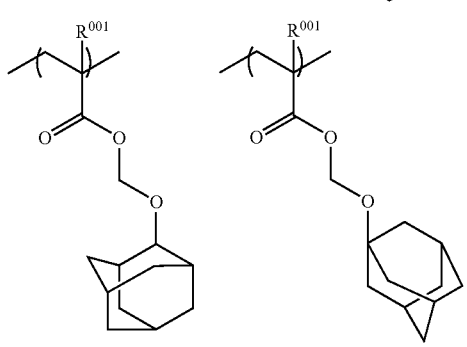
-continued
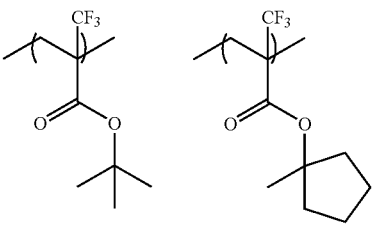
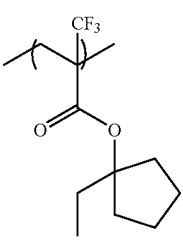
Herein $R^{001}$ are as defined above.
Also included in the scope of formula (R1) are copolymers of (α-trifluoromethyl)acrylic acid esters with maleic anhydride and copolymers of cycloolefins with maleic anhydride, examples of which are shown below, but not limited thereto.
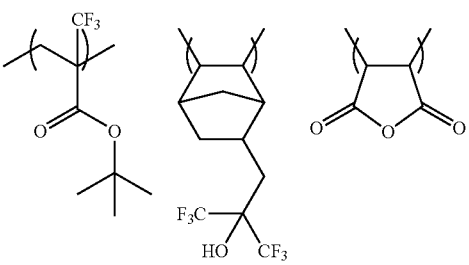
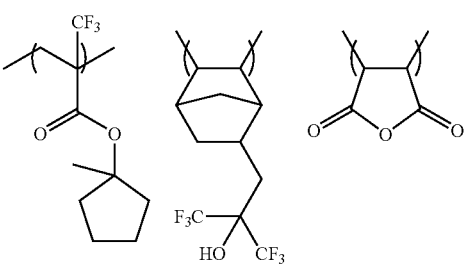
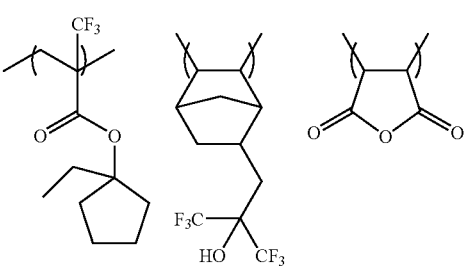

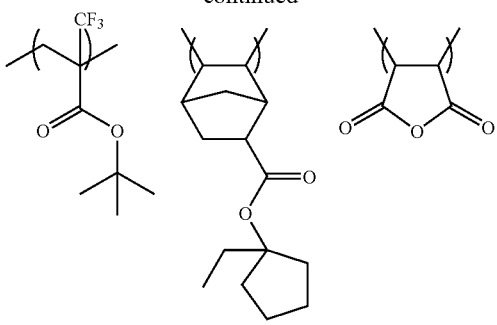
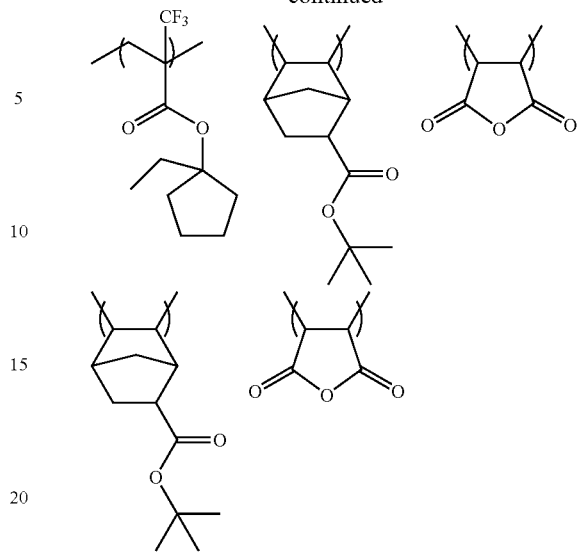
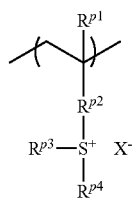

Furthermore, recurring units having a photosensitive sulfonium salt as represented by the following general formula may be copolymerized with (R1) and/or (R2) and incorporated in the polymers.

Herein $R^{p1}$ is hydrogen or methyl. $R^{p2}$ is a phenylene group, —O—$R^{p5}$— or —C(=O)—$X^p$—$R^{p5}$— wherein $X^p$ is an oxygen atom or NH, and $R^{p5}$ is a straight, branched or cyclic $C_1$-$C_6$ alkylene, alkenylene or phenylene group which may contain a carbonyl, ester or ether group. $R^{p3}$ and $R^{p4}$ are each independently a straight, branched or cyclic $C_1$-$C_{12}$ alkyl group which may contain a carbonyl, ester or ether group, or a $C_6$-$C_{12}$ aryl group, $C_7$-$C_{20}$ aralkyl group or thiophenyl group. X is a non-nucleophilic counter ion.

The polymer used as base resin (B) generally has a weight average molecular weight (Mw) of 1,000 to 100,000, preferably 3,000 to 30,000, as measured by GPC versus polystyrene standards. The polymer used as the base resin is not limited to one type and a mixture of two or more polymers may be used. The use of plural polymers allows for easy adjustment of resist properties.

Photoacid Generator

In the resist composition, (C) a compound capable of generating an acid in response to high-energy radiation, which is generally referred to as "photoacid generator" or PAG, may be included in order that the resist composition function as a chemically amplified positive resist composition. The PAG may be any compound capable of generating an acid upon exposure of high-energy radiation. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0123] to [0138].

Of the PAGs, compounds having the general formula (C)-1 are preferred.

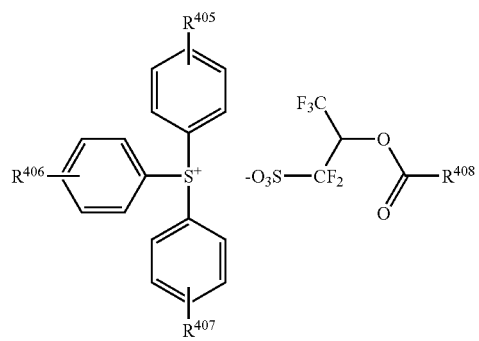

(C)-1

Herein $R^{405}$, $R^{406}$, and $R^{407}$ are each independently hydrogen or a straight, branched or cyclic, monovalent $C_1$-$C_{20}$ hydrocarbon group which may contain a heteroatom, typically an alkyl or alkoxy group. $R^{408}$ is a straight, branched or cyclic, monovalent $C_7$-$C_{30}$ hydrocarbon group which may contain a heteroatom.

Examples of the hydrocarbon groups optionally containing a heteroatom, represented by $R^{405}$, $R^{406}$, and $R^{407}$, include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero-atomic grouping such as —O—, —S—, —SO—, —SO$_2$—, —NH—, —C(=O)—, —C(=O)O—, or —C(=O)NH—, or any hydrogen atom is replaced by a functional group such as —OH, —NH$_2$, —CHO, or —CO$_2$H. Examples of the straight, branched or cyclic, monovalent $C_7$-$C_{30}$ hydrocarbon groups optionally containing a heteroatom, represented by $R^{408}$, are shown below, but not limited thereto.

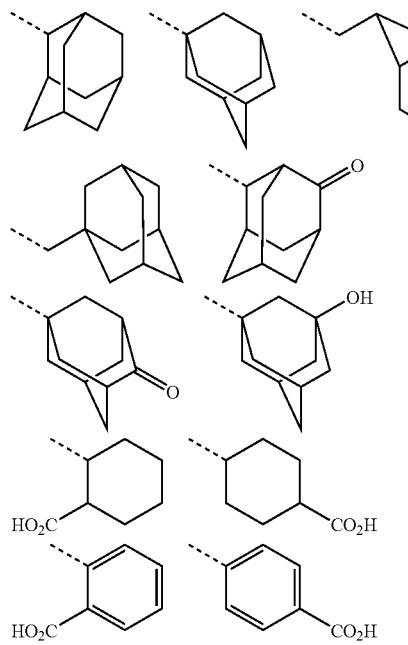

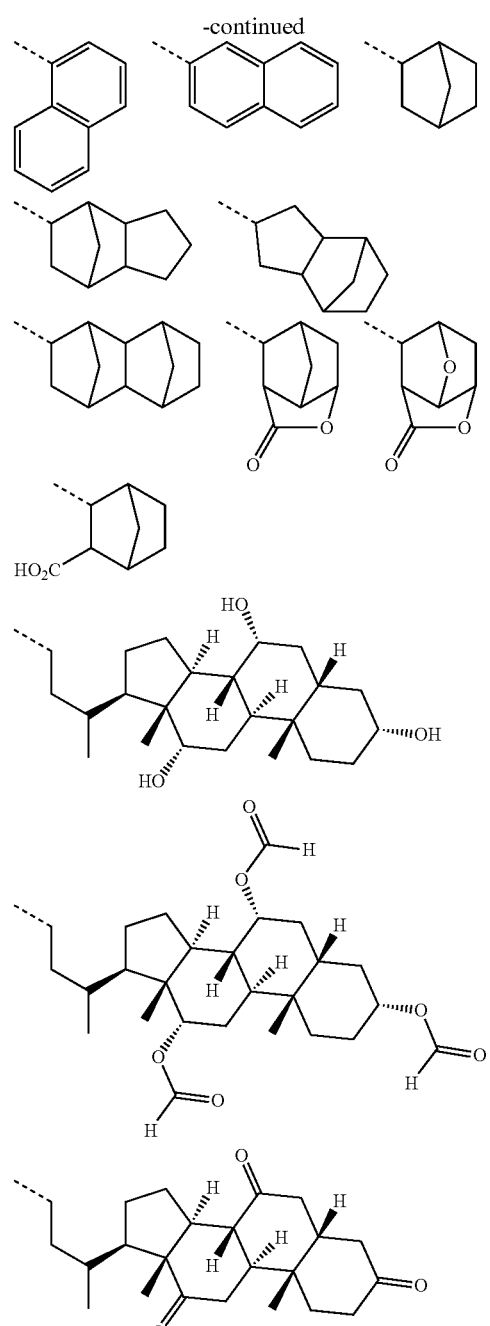

Illustrative examples of acid generator (C)-1 are shown below, but not limited thereto.

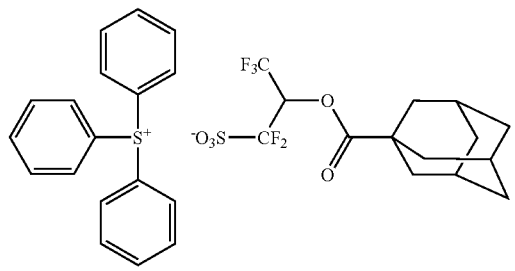

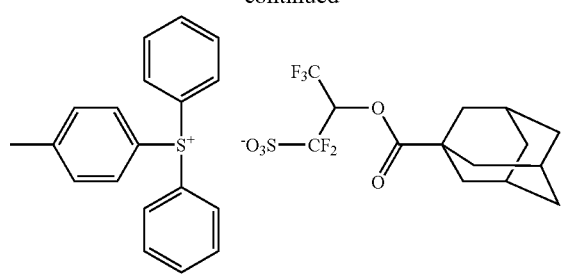
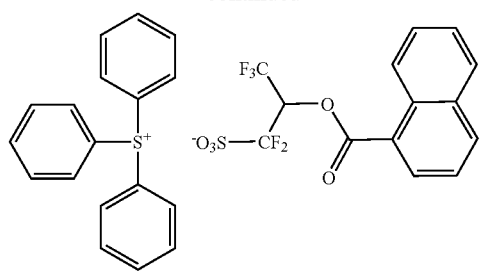
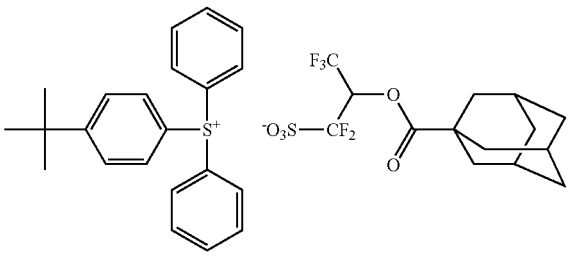
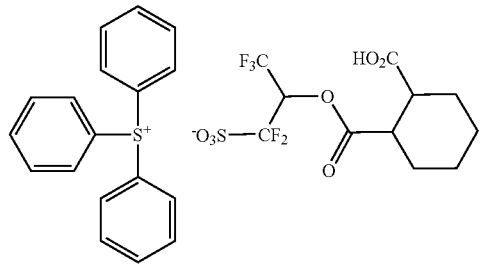
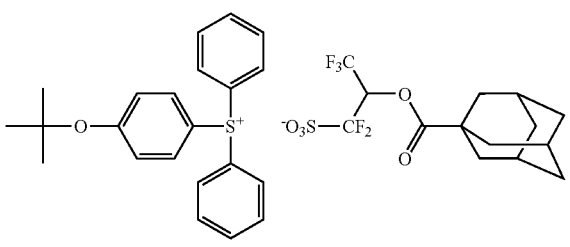
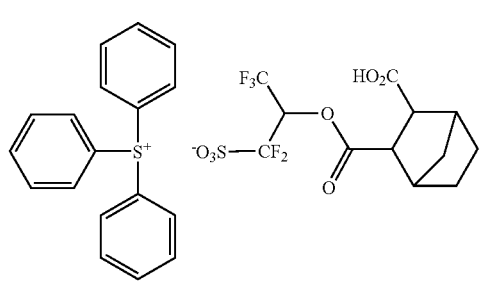
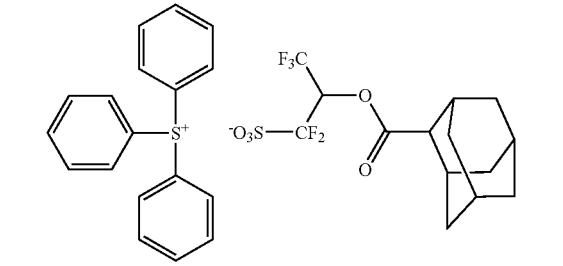
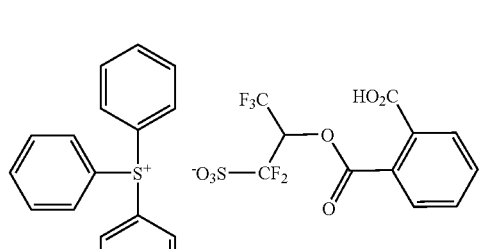
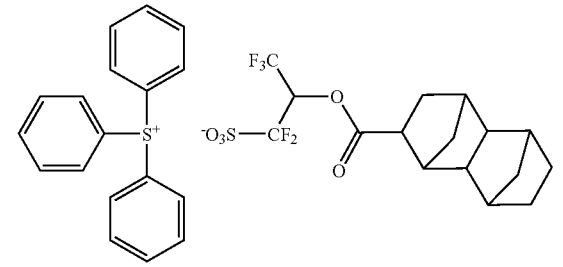
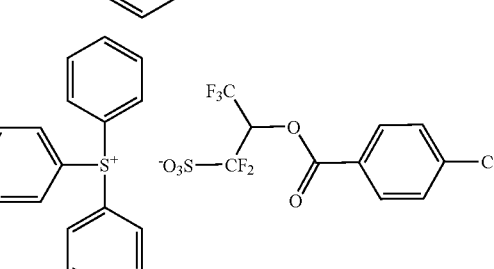
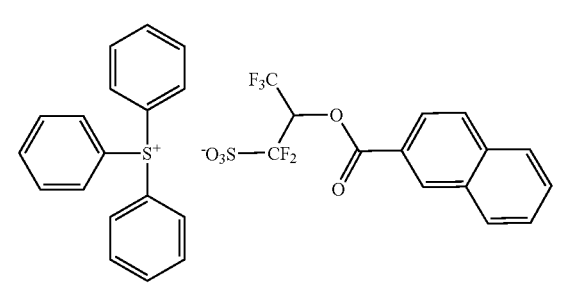
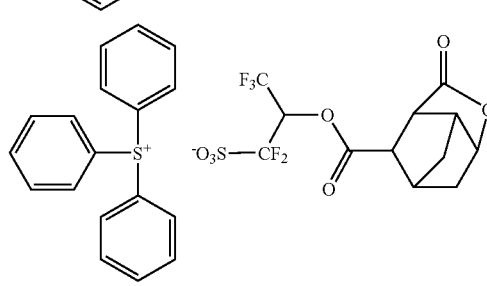

-continued

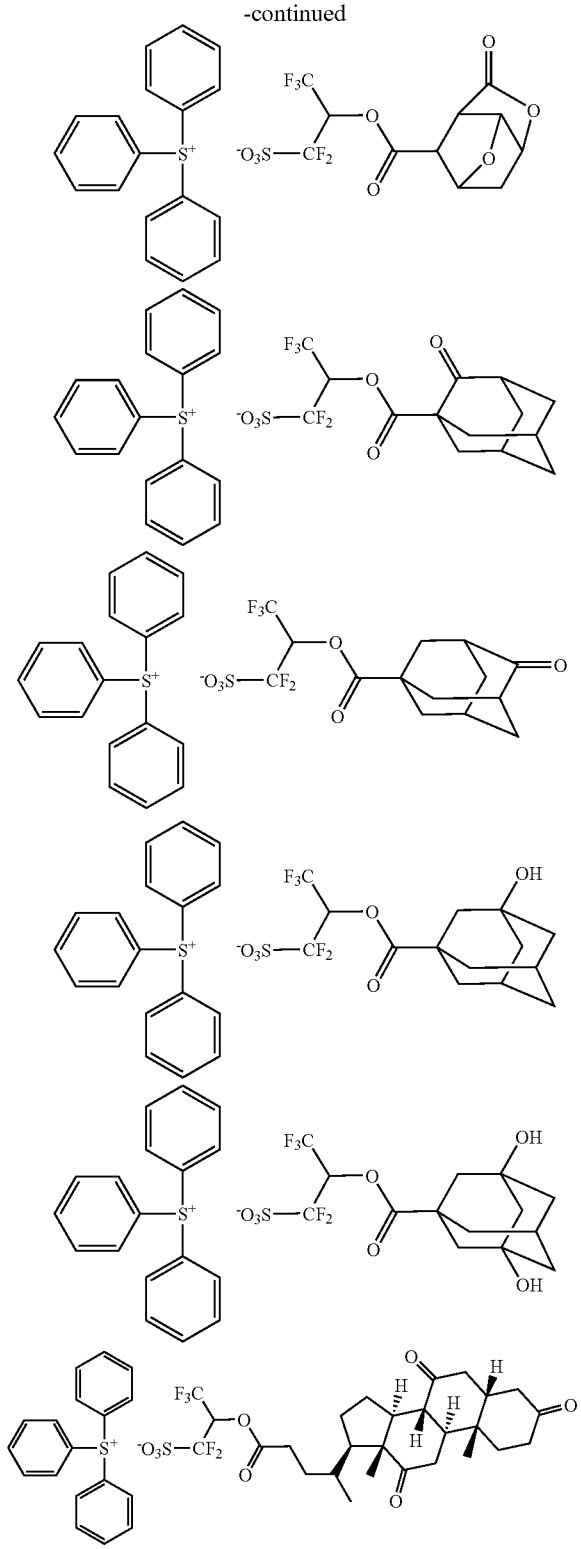

In the chemically amplified resist composition, PAG as component (C) may be added in any desired amount as long as the objects of the invention are not compromised. An appropriate amount of PAG is 0.1 to 10 parts, and more preferably 0.1 to 5 parts by weight per 100 parts by weight of the base resin in the composition. Too large an amount of PAG may give rise to problems of degraded resolution and foreign matter upon development and resist film peeling. The PAG may be used alone or in admixture of two or more. The transmittance of the resist film can be controlled by using a PAG having a low transmittance at the exposure wavelength and adjusting the amount of the PAG added.

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is also an onium salt, an exchange from the strong acid (generated upon exposure to high-energy radiation) to a weak acid as above can take place, but it never happens that the weak acid (generated upon exposure to high-energy radiation) collides with the unreacted onium salt capable of generating a strong acid to induce a salt exchange. This is because of a likelihood of an onium cation forming an ion pair with a stronger acid anion.

The resist composition may further comprise one or more of (D) an organic solvent, (E) a basic compound, (F) a dissolution regulator, (G) a surfactant, and (H) an acetylene alcohol derivative.

The organic solvent (D) used herein may be any organic solvent in which polymer P1, the base resin, PAG, and other components are soluble. Exemplary solvents are described in JP-A 2008-111103, paragraph [0144]. The organic solvents may be used alone or in combinations of two or more thereof. An appropriate amount of the organic solvent used is 200 to 3,000 parts, especially 400 to 2,500 parts by weight per 100 parts by weight of the base resin (B). It is recommended to use diethylene glycol dimethyl ether, 1-ethoxy-2-propanol, propylene glycol monomethyl ether acetate (PGMEA), and mixtures thereof because the acid generator is most soluble therein.

As the basic compound (E), nitrogen-containing organic compounds are preferred and may be used alone or in admixture. Those compounds capable of suppressing the rate of diffusion when the acid generated by the acid generator diffuses within the resist film are useful. The inclusion of nitrogen-containing organic compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide, imide and carbamate derivatives. Illustrative examples are described in JP-A 2008-111103, paragraphs [0149] to [0163]. The basic compound is preferably used in an amount of 0.001 to 2 parts, more preferably 0.01 to 1 part by weight per 100 parts by weight of the base resin (B). At least 0.001 phr achieves the desired addition effect whereas up to 2 phr minimizes the risk of reducing sensitivity.

Tertiary amines are especially preferred as the basic compound. Examples include tri-n-butylamine, tri-n-pentylamine, tri-n-hexylamine, tri-n-octylamine, N,N-dimethylaniline, triethanolamine, triisopropanolamine, tris(2-methoxymethoxyethyl)amine, tris(2-methoxyethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, tris(2-benzoyloxyethyl)amine, tris[2-(4-methoxybenzoyloxy)ethyl]amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Illustrative examples of the basic compounds include 1-[2-(methoxymethoxy)ethyl]pyrrolidine, 1-[2-(methoxymethoxy)ethyl]piperidine, 4-[2-(methoxymethoxy)ethyl]morpholine, 1-[2-(methoxymethoxy)ethyl]imidazole, 1-[2-(methoxymethoxy)ethyl]benzimidazole, 1-[2-(methoxymethoxy)ethyl]-2-phenylbenzimidazole, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 1-[2-[(2-methoxyethoxy)methoxy]ethyl]imidazole, 1-[2-[(2-methoxyethoxy)methoxy]ethyl]benzimidazole, 1-[2-[(2-methoxyethoxy)methoxy]ethyl]-2-phenylbenzimidazole, 1-[2-[2-(2-methoxyethoxy)ethoxy]ethyl]pyrrolidine, 1-[2-[2-(2-methoxyethoxy)ethoxy]ethyl]piperidine, 4-[2-[2-(2-methoxyethoxy)ethoxy]ethyl]morpholine, 1-[2-[2-(2-methoxyethoxy)ethoxy]ethyl]imidazole, 1-[2-[2-(2-methoxyethoxy)ethoxy]ethyl]benzimidazole, 1-[2-[2-(2-methoxyethoxy)ethoxy]ethyl]-2-phenylbenzimidazole, 1-[2-[2-(2-butoxyethoxy)ethoxy]ethyl]pyrrolidine, 1-[2-[2-(2-butoxyethoxy)ethoxy]ethyl]piperidine, 4-[2-[2-(2-butoxyethoxy)ethoxy]ethyl]morpholine, 1-[2-[2-(2-butoxyethoxy)ethoxy]ethyl]imidazole, 1-[2-[2-(2-butoxyethoxy)ethoxy]ethyl]benzimidazole, 1-[2-[2-(2-butoxyethoxy)ethoxy]ethyl]-2-phenylbenzimidazole, 1-[2-[2-[2-(2-methoxyethoxy)ethoxy]ethoxy]ethyl]pyrrolidine, 1-[2-[2-[2-(2-methoxyethoxy)ethoxy]ethoxy]ethyl]piperidine, 4-[2-[2-[2-(2-methoxyethoxy)ethoxy]ethoxy]ethyl]morpholine, 1-[2-[2-[2-(2-methoxyethoxy)ethoxy]ethoxy]ethyl]imidazole, 1-[2-[2-[2-(2-methoxyethoxy)ethoxy]ethoxy]ethyl]benzimidazole, 1-[2-[2-[2-(2-methoxyethoxy)ethoxy]ethoxy]ethyl]-2-phenyl-benzimidazole, 4-[2-{2-[2-(2-butoxyethoxy)ethoxy]ethoxy}ethyl]morpholine, 2-(1-pyrrolidinyl)ethyl acetate, 2-piperidinoethyl acetate, 2-morpholinoethyl acetate, 2-(1-imidazolyl)ethyl acetate, 2-(1-benzimidazolyl)ethyl acetate, 2-(2-phenyl-1-benzimidazolyl)ethyl acetate, 2-methoxyethyl morpholinoacetate, 2-(1-pyrrolidinyl)ethyl 2-methoxyacetate, 2-piperidinoethyl 2-methoxyacetate, 2-morpholinoethyl 2-methoxyacetate, 2-(1-imidazolyl)ethyl 2-methoxyacetate, 2-(1-benzimidazolyl)ethyl 2-methoxyacetate, 2-(2-phenyl-1-benzimidazolyl)ethyl 2-methoxyacetate, 2-(1-pyrrolidinyl)ethyl 2-(2-methoxyethoxy)acetate, 2-piperidinoethyl 2-(2-methoxyethoxy)acetate, 2-morpholinoethyl 2-(2-methoxyethoxy)acetate, 2-(1-imidazolyl)ethyl 2-(2-methoxyethoxy)acetate, 2-(1-benzimidazolyl)ethyl 2-(2-methoxyethoxy)acetate, 2-(2-phenyl-1-benzimidazolyl)ethyl 2-[2-(2-methoxyethoxy)ethoxy]acetate, 2-piperidinoethyl 2-[2-(2-methoxyethoxy)ethoxy]acetate, 2-morpholinoethyl 2-[2-(2-methoxyethoxy)ethoxy]acetate, 2-(1-imidazolyl)ethyl 2-[2-(2-methoxyethoxy)ethoxy]acetate, 2-(1-benzimidazolyl)ethyl 2-[2-(2-methoxyethoxy)ethoxy]acetate, 2-(2-phenyl-1-benzimidazolyl)ethyl 2-[2-(2-methoxyethoxy)ethoxy]acetate, 2-morpholinoethyl butyrate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-acetyl)cholate, 2-morpholinoethyl tris(O-formyl)cholate, 2-morpholinoethyl dehydrocholate, 2-morpholinoethyl cyclopentanecarboxylate, 2-morpholinoethyl cyclohexanecarboxylate, 2-(1-pyrrolidinyl)ethyl 7-oxanorbornane-2-carboxylate, 2-piperidinoethyl 7-oxanorbornane-2-carboxylate, 2-morpholinoethyl 7-oxanorbornane-2-carboxylate, 2-(1-imidazolyl)ethyl 7-oxanorbornane-2-carboxylate, 2-(1-benzimidazolyl)ethyl 7-oxanorbornane-2-carboxylate, 2-(2-phenyl-1-benzimidazolyl)ethyl 7-oxanorbornane-2-carboxylate, 2-morpholinoethyl adamantanecarboxylate, 2-(1-pyrrolidinyl)ethyl formate, 2-piperidinoethyl propionate, 2-morpholinoethyl acetoxyacetate, 2-(1-pyrrolidinyl)ethyl methoxyacetate, 2-(1-pyrrolidinyl) ethyl benzoate, 2-piperidinoethyl benzoate, 2-morpholinoethyl benzoate, 2-(1-imidazolyl)ethyl benzoate, 2-(1-benzimidazolyl)ethyl benzoate, 2-(2-phenyl-1-benzimidazolyl)ethyl benzoate, 2-(1-pyrrolidinyl)ethyl 4-methoxybenzoate, 2-piperidinoethyl 4-methoxybenzoate, 2-morpholinoethyl 4-methoxybenzoate, 2-(1-imidazolyl)ethyl 4-methoxybenzoate, 2-(1-benzimidazolyl)ethyl 4-methoxybenzoate, 2-(2-phenyl-1-benzimidazolyl)ethyl 4-methoxybenzoate, 2-(1-pyrrolidinyl)ethyl 4-phenylbenzoate, 2-piperidinoethyl 4-phenylbenzoate, 2-morpholinoethyl 4-phenylbenzoate, 2-(1-imidazolyl)ethyl 4-phenylbenzoate, 2-(1-benzimidazolyl)ethyl 4-phenylbenzoate, 2-(2-phenyl-1-benzimidazolyl)ethyl 4-phenylbenzoate, 2-(1-pyrrolidinyl)ethyl 1-naphthalenecarboxylate, 2-piperidinoethyl 1-naphthalenecarboxylate, 2-morpholinoethyl 1-naphthalenecarboxylate, 2-(1-imidazolyl)ethyl 1-naphthalenecarboxylate, 2-(1-benzimidazolyl)ethyl 1-naphthalenecarboxylate, 2-(2-phenyl-1-benzimidazolyl)ethyl 1-naphthalenecarboxylate, 2-(1-pyrrolidinyl)ethyl 2-naphthalenecarboxylate, 2-piperidinoethyl 2-naphthalenecarboxylate, 2-morpholinoethyl 2-naphthalenecarboxylate, 2-(1-imidazolyl)ethyl 2-naphthalenecarboxylate, 2-(1-benzimidazolyl)ethyl 2-naphthalenecarboxylate, 2-(2-phenyl-1-benzimidazolyl)ethyl 2-naphthalenecarboxylate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, etc.

The dissolution regulator or inhibitor (F) which can be added to the resist composition is a compound having on the molecule at least two phenolic hydroxyl groups which are protected with an acid labile group, or a compound having on the molecule at least one carboxyl group which is protected with an acid labile group. Exemplary regulators are described in JP-A 2008-122932, paragraphs [0155] to [0178].

Optionally, the resist composition may further comprise (G) a surfactant which is commonly used for facilitating the coating operation. Exemplary surfactants are described in JP-A 2008-111103, paragraph [0166].

Optionally, the resist composition may further comprise (H) an acetylene alcohol derivative. Exemplary compounds are described in JP-A 2008-122932, paragraphs [0180] to [0181].

Optionally, the resist composition may further comprise (I) a fluorinated alcohol. When the resist composition contains (E) a basic compound, the fluorinated ester in recurring units (1), (1a), (1') or (1a') of polymer P1 is subject to gradual hydrolysis during storage, which may lead to a decline of water repellent and water slip performance during the immersion lithography process. In such a case, (I) a fluorinated alcohol may be added to the resist composition for suppressing the hydrolysis which is otherwise promoted by the basic compound (E), thus enhancing storage stability.

Examples of the fluorinated alcohol include, but are not limited to, 2,2,2-trifluoroethanol, 2,2,3,3-tetrafluoro-1-propanol, 1,3-difluoro-2-propanol, 1,1,1,3,3,3-hexafluoro-2-propanol, 1,1,1,3,3,3-hexafluoro-2-trifluoromethyl-2-propanol, 2,2,3,4,4,4-hexafluoro-1-butanol, 2,2,2',2',2'-hexafluorocumylalcohol, and 2,2,3,3,4,4,5,5-octafluoro-1-pentanol.

The fluorinated alcohol (I) is preferably used in an amount of 0.01 to 10 parts, more preferably 0.01 to 5 parts by weight per part by weight of the basic compound (E).

Pattern Forming Process

It is now described how to form a pattern using the resist composition of the invention. A pattern may be formed from the resist composition using any well-known lithography process. The preferred method includes at least the steps of forming a photoresist coating on a substrate, exposing it to high-energy radiation, and developing it with a developer.

The resist composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a photoresist film of 0.1 to 2.0 µm thick. It is noted in conjunction with spin coating that if the resist composition is coated onto the surface of a substrate which has been wetted with the resist solvent or a solution miscible with the resist solvent, then the amount of the resist composition dispensed can be reduced (see JP-A H09-246173).

A mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be dry exposure in air or nitrogen atmosphere, EB or EUV exposure in vacuum, or immersion lithography of providing a liquid, typically water between the photoresist film and the projection lens.

The immersion lithography involves prebaking a resist film and exposing the resist film to light through a projection lens, with pure water or similar liquid interposed between the resist film and the projection lens. Since this allows projection lenses to be designed to a NA of 1.0 or higher, formation of finer patterns is possible. The immersion lithography is important for the ArF lithography to survive to the 45-nm node and onward. The liquid used herein may be a liquid with a refractive index of at least 1 which is highly transparent at the exposure wavelength, typically pure water or alkane.

The photoresist film formed from the resist composition has such barrier properties to water that it may inhibit resist components from being leached out in water and as a consequence, eliminate a need for a protective coating in the immersion lithography and reduce the cost associated with protective coating formation or the like. The photoresist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film.

The resist protective coating may be either of the solvent stripping type or of the developer dissolution type. A resist protective coating of the developer dissolution type is advantageous for process simplicity because it can be stripped during development of a photoresist film of the resist composition.

The resist protective coating used in the immersion lithography may be formed from a coating solution, for example, a topcoat solution of a polymer having acidic units such as 1,1,1,3,3,3-hexafluoro-2-propanol, carboxyl or sulfo groups which is insoluble in water and soluble in an alkaline developer liquid, in a solvent selected from alcohols of at least 4 carbon atoms, ethers of 8 to 12 carbon atoms, and mixtures thereof. The resist protective coating is not limited thereto.

The resist protective coating may be formed by spin coating a topcoat solution onto a prebaked photoresist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating material dispensed in forming a protective coating by spin coating may be reduced by previously wetting the resist film surface with a suitable solvent and applying the protective coating material thereto.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process.

After exposure, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate.

Where polymer P1 is used as an additive to a resist material for use with mask blanks, a resist solution is prepared by adding polymer P1 to a base resin and dissolving them in an organic solvent. The resist solution is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein.

As the base resin of the resist composition for use with mask blanks, novolac resins and hydroxystyrene are often used. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinylnaphthalene, vinylanthracene, vinylpyrene, hydroxyvinylnaphthalene, hydroxyvinylanthracene, indene, hydroxyindene, acenaphthylene, and norbornadiene derivatives.

Once the resist coating is formed, the structure is exposed to EB in vacuum using an EB image-writing system. The exposure is followed by post-exposure baking (PEB) and development in an alkaline developer for 10 to 300 seconds, thereby forming a pattern.

EXAMPLE

Examples are given below by way of illustration and not by way of limitation. The abbreviations Mw and Mn are weight and number average molecular weights, respectively, as measured by gel permeation chromatography (GPC) versus polystyrene standards, and Mw/Mn is a polydispersity index. Et stands for ethyl, and PGMEA for propylene glycol monomethyl ether acetate.

Monomer Synthesis

Fluorinated monomers (Monomers 1 to 6) corresponding to recurring units of formula (1), (1a), (1') or (1a') essential for polymer P1 used as the resist additive were synthesized according to the following formulation.

Monomer Synthesis Example 1

Synthesis of Monomer 1

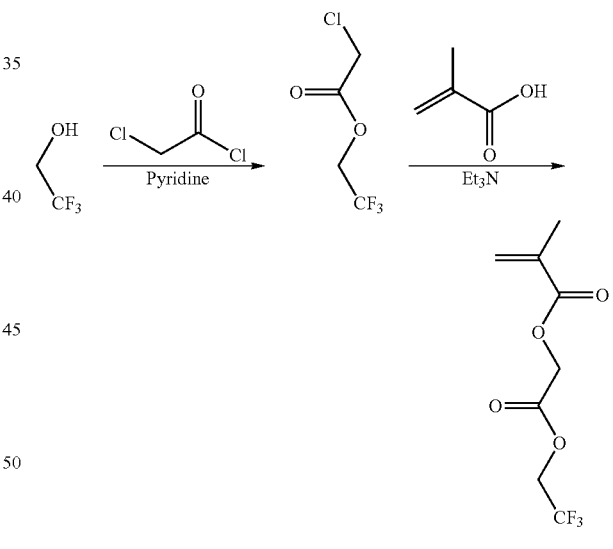

Monomer 1

Monomer Synthesis Example 1-1

Synthesis of 2,2,2-trifluoroethyl chloroacetate

A flask was charged with 100 g of 2,2,2-trifluoroethanol, 136 g of chloroacetic acid chloride, and 500 g of acetonitrile. Below 20° C., 87 g of pyridine was added dropwise to the solution, which was stirred for 5 hours at room temperature. 200 g of water was added dropwise, followed by ordinary aqueous work-up. Distillation under atmospheric pressure gave 146 g of the end compound (yield 83%).

Boiling point: 126° C./101 kPa
$^1$H-NMR (600 MHz in CDCl$_3$):
δ=4.17 (2H, s), 4.56 (2H, q) ppm
$^{19}$F-NMR (565 MHz in CDCl$_3$, trifluoroacetic acid standard):
δ=−74.9 (3F, t) ppm Monomer Synthesis Example 1-2

Synthesis of (2,2,2-trifluoroethoxycarbonyl)methyl methacrylate (Monomer 1)

Below 25° C., a mixture of 58 g of triethylamine and 50 g of dimethylformamide was added dropwise to a mixture of 51 g of methacrylic acid, 81 g of the chloroacetic acid ester of Monomer Synthesis Example 1-1, 3.4 g of sodium iodide, and 250 g of dimethylformamide. The mixture was stirred at the temperature for 8 hours. 200 g of 10% hydrochloric acid was added below 30° C., followed by ordinary aqueous work-up. Distillation under reduced pressure gave 84 g of the target compound (yield 81%).
Boiling point: 75-76° C./400 Pa
IR (thin film): ν=2979, 2966, 1787, 1731, 1639, 1421, 1384, 1324, 1286, 1168, 1147, 1074, 979 cm$^{-1}$
$^1$H-NMR (600 MHz in CDCl$_3$):
δ=1.98 (3H, s), 4.54 (2H, q), 4.78 (2H, s), 5.68 (1H, m), 6.22 (1H, m) ppm
$^{19}$F-NMR (565 MHz in CDCl$_3$, trifluoroacetic acid standard):
δ=−74.6 (3F, t) ppm Monomer Synthesis Example 2

Synthesis of Monomer 2

Synthesis was effected by the same procedure as in Monomer Synthesis Example 1-1 to 1-2 aside from using 1,1,1,3,3,3-hexafluoroisopropyl alcohol instead of 2,2,2-trifluoroethanol, obtaining (1,1,1,3,3,3-hexafluoroisopropoxycarbonyl)methyl methacrylate (two-step yield 64%).
Boiling point: 57-58° C./266 Pa
IR (thin film): ν=2979, 2966, 1787, 1731, 1639, 1421, 1384, 1324, 1286, 1168, 1147, 1074, 979 cm$^{-1}$
$^1$H-NMR (600 MHz in DMSO-d$_6$):
δ=1.91 (3H, s), 5.06 (2H, s), 5.81 (1H, m), 6.13 (1H, m), 6.91 (1H, sept) ppm
$^{19}$F-NMR (565 MHz in DMSO-d$_6$, trifluoroacetic acid standard):
δ=−74.6 (6F, d) ppm Monomer Synthesis Example 3

Synthesis of Monomer 3

Synthesis was effected by the same procedure as in Monomer Synthesis Example 1-1 to 1-2 aside from using 2,2,3,3,4,4,5,5-octafluoro-1-pentanol instead of 2,2,2-trifluoroethanol, obtaining (2,2,3,3,4,4,5,5-octafluoro-1-pentyloxycarbonyl)methyl methacrylate (two-step yield 78%).
Boiling point: 81-82° C./40 Pa
IR (thin film): ν=2967, 1785, 1731, 1639, 1456, 1423, 1405, 1378, 1324, 1301, 1172, 1149, 1074, 948 cm$^{-1}$
$^1$H-NMR (600 MHz in DMSO-d$_6$):
δ=1.90 (3H, s), 4.88 (2H, t), 4.89 (2H, s), 5.79 (1H, m), 6.11 (1H, m), 7.05 (1H, ddd) ppm Monomer Synthesis Example 4

Synthesis of Monomer 4

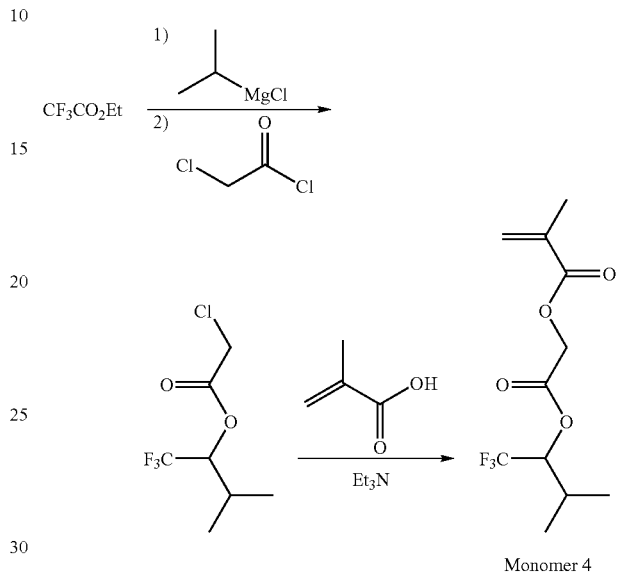

Monomer 4

Monomer Synthesis Example 4-1

Synthesis of 1,1,1-trifluoro-3-methylbutan-2-yl chloroacetate

A flask was charged with 1.1 L of a 1 mol/L tetrahydrofuran solution of isopropylmagnesium chloride, to which 142 g of ethyl trifluoroacetate was added dropwise below 20° C. The solution was stirred for 2 hours at room temperature, after which 282 g of chloroacetic acid chloride was added dropwise below 40° C. The solution was stirred for 2 hours at room temperature, after which 950 g of 10% hydrochloric acid was added to stop the reaction. Ordinary aqueous work-up was followed by distillation under reduced pressure, obtaining 195 g of the end compound (yield 89%).
Boiling point: 112-113° C./16 kPa
$^1$H-NMR (600 MHz in DMSO-d$_6$):
δ=0.95 (3H, d), 0.97 (3H, d), 2.15 (1H, sept), 4.61 (2H, q), 5.33 (1H, dquin) ppm Monomer Synthesis Example 4-2

Synthesis of (1,1,1-trifluoro-3-methylbutan-2-yloxycarbonyl)methyl methacrylate (Monomer 4)

Below 25° C., a mixture of 127 g of triethylamine and 100 g of dimethylformamide was added dropwise to a mixture of 112 g of methacrylic acid, 219 g of the chloroacetic acid ester of Monomer Synthesis Example 4-1, 4.5 g of sodium iodide, and 300 g of dimethylformamide. The mixture was stirred at the temperature for 8 hours. 300 g of 10% hydrochloric acid was added below 30° C., followed by ordinary aqueous work-up. Distillation under reduced pressure gave 236 g of the target compound (yield 88%).

Boiling point: 83-84° C./465 Pa

IR (thin film): ν=2977, 2888, 1783, 1733, 1639, 1471, 1423, 1388, 1322, 1284, 1272, 1249, 1201, 1147, 1091, 1066, 1020 cm$^{-1}$ $^1$H-NMR (600 MHz in DMSO-d$_6$):

δ=0.92 (3H, d), 0.96 (3H, d), 1.90 (3H, s), 2.13 (1H, sept), 4.93 (2H, q), 5.33 (1H, dquin), 5.79 (1H, m), 6.12 (1H, m) ppm $^{19}$F-NMR (565 MHz in DMSO-d$_6$, trifluoroacetic acid standard):

δ=−73.5 (3F, d) ppm

Monomer Synthesis Example 5

Synthesis of Monomer 5

Synthesis was effected by the same procedure as in Monomer Synthesis Example 4-1 to 4-2 aside from using cyclohexylmagnesium chloride in tetrahydrofuran instead of the isopropylmagnesium chloride in tetrahydrofuran, obtaining (1-trifluoromethyl-1-cyclohexylmethoxycarbonyl)methyl methacrylate (two-step yield 77%).

Boiling point: 79-80° C./22 Pa

IR (thin film): ν=2933, 2858, 1781, 1733, 1639, 1454, 1421, 1388, 1322, 1284, 1240, 1203, 1172, 1145, 1105, 943 cm$^{-1}$ $^1$H-NMR (600 MHz in DMSO-d$_6$):

δ=1.05-1.30 (5H, m), 1.56-1.74 (5H, m), 1.78-1.85 (1H, m), 1.90 (3H, s), 4.92 (2H, q), 5.30 (1H, quin), 5.79 (1H, m), 6.12 (1H, m) ppm $^{19}$F-NMR (565 MHz in DMSO-d$_6$, trifluoroacetic acid standard):

δ=−73.0 (3F, d) ppm

Monomer Synthesis Example 6

Synthesis of Monomer 6

Synthesis was effected by the same procedure as in Monomer Synthesis Example 4-1 to 4-2 aside from using ethyl heptafluoropropionate instead of ethyl trifluoroacetate, obtaining (4,4,5,5,6,6,6-heptafluoro-2-methylhexan-3-yloxy-carbonyl)methyl methacrylate (two-step yield 79%).

Boiling point: 57-58° C./25 Pa

IR (thin film): ν=2977, 2890, 1785, 1733, 1639, 1471, 1456, 1423, 1388, 1349, 1322, 1299, 1228, 1201, 1147, 1116, 1095, 1068 cm$^{-1}$ $^1$H-NMR (600 MHz in DMSO-d$_6$):

δ=0.95 (3H, t), 1.90 (3H, m), 2.25-2.33 (1H, m), 4.92 (2H, q), 5.52 (1H, dt), 5.79 (1H, m), 6.12 (1H, m) ppm $^{19}$F-NMR (565 MHz in DMSO-d$_6$, trifluoroacetic acid standard):

δ=−127.40 (2F, dq), −122.10 (1F, d), −118.20 (1F, d), −81.37 (3F, t) ppm

Polymer Synthesis

Polymerizable monomers (Monomers 1 to 13) used in polymer synthesis are identified below by their structural formulae.

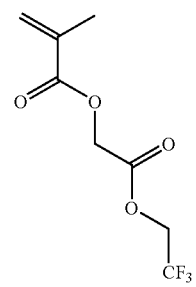

Monomer 1

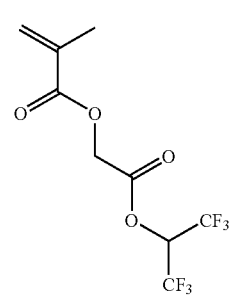

Monomer 2

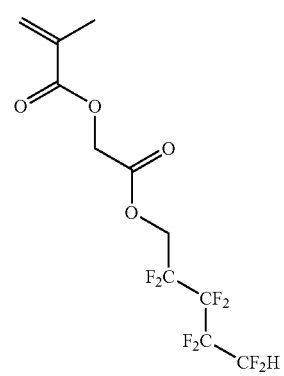

Monomer 3

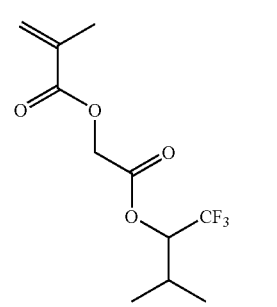

Monomer 4

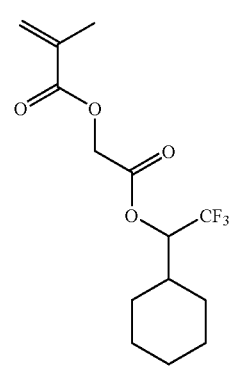

Monomer 5

Monomer 6

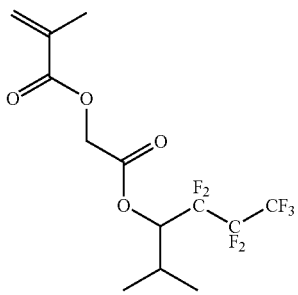

Monomer 7

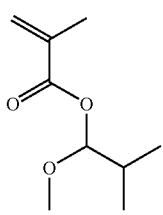

Monomer 8

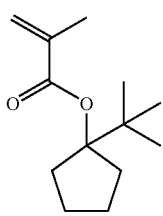

Monomer 9

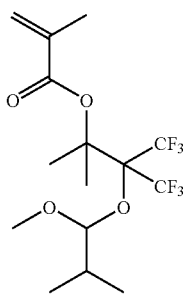

Monomer 10

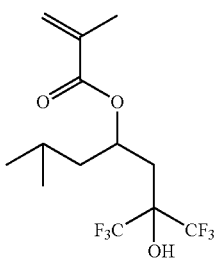

Monomer 11

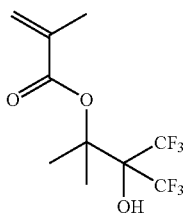

Monomer 12

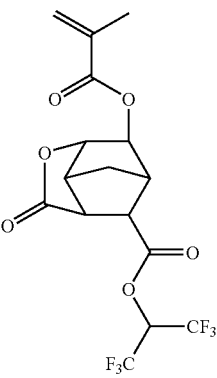

Monomer 13

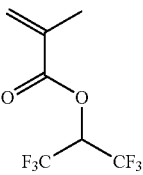

Polymer Synthesis Example 1

Copolymerization of Monomers 1 and 7 (50/50) (Polymer 1)

In a nitrogen atmosphere, a flask was charged with 56.83 g of Monomer 1, 43.36 g of Monomer 7, 5.78 g of dimethyl 2,2'-azobis(isobutyrate), and 100.0 g of methyl ethyl ketone to form a monomer solution at a temperature of 20-25° C. In a nitrogen atmosphere, another flask was charged with 50.0 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. Using an evaporator, the solvent was evaporated off from the polymerization solution. The resulting white solid was vacuum dried at 50° C. for 20 hours, yielding 98.3 g of the target polymer, designated Polymer 1. On $^1$H-NMR analysis of its composition, the copolymer consisted of Monomers 1 and 7 in a ratio of 51/49 mol %. On GPC analysis, the copolymer had a Mw of 9,700 and a Mw/Mn of 1.4.

Polymer Synthesis Examples 2 to 17

As in Polymer Synthesis Example 1, Polymers 2 to 17 were synthesized using the polymerizable monomers (Monomers 1 to 12) in accordance with the formulation shown in Tables 1 and 2. It is noted that the values of formulation in Tables 1 and 2 are ratios (mol %) of monomer charges, and the values attached to recurring units in the formulae are compositional ratios analyzed by $^1$H-NMR spectroscopy.

TABLE 1

| Formulation, mol % | Monomer | | | | | | | | Yield, % | Mw | Mw/Mn |
| --- | --- | --- | --- | --- | --- | --- | --- | --- | --- | --- | --- |
| | 1 | 2 | 3 | 4 | 5 | 6 | 7 | 8 | | | |
| Polymer 1 | 50 | | | | | | 50 | | 98.3 | 9,700 | 1.4 |
| Polymer 2 | | 50 | | | | | 50 | | 98.0 | 9,600 | 1.4 |
| Polymer 3 | | | 50 | | | | 50 | | 97.3 | 9,800 | 1.4 |

TABLE 1-continued
| Formulation, mol % | Monomer | | | | | | | | Yield, % | Mw | Mw/Mn |
|---|---|---|---|---|---|---|---|---|---|---|---|
| | 1 | 2 | 3 | 4 | 5 | 6 | 7 | 8 | | | |
| Polymer 4 | | | | 50 | | | 50 | | 98.1 | 9,300 | 1.4 |
| Polymer 5 | | | | | 50 | | 50 | | 97.3 | 9,400 | 1.4 |
| Polymer 6 | | | | | | 50 | 50 | | 98.5 | 9,800 | 1.4 |
| Polymer 7 | 50 | | | | | | | 50 | 98.2 | 9,200 | 1.4 |
| Polymer 8 | | 50 | | | | | | 50 | 97.3 | 9,100 | 1.4 |
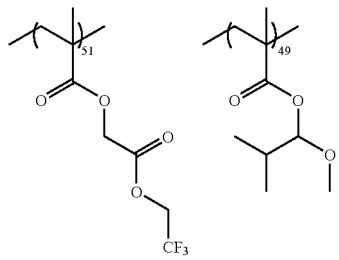
Polymer 1
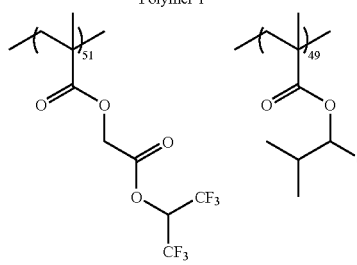
Polymer 2
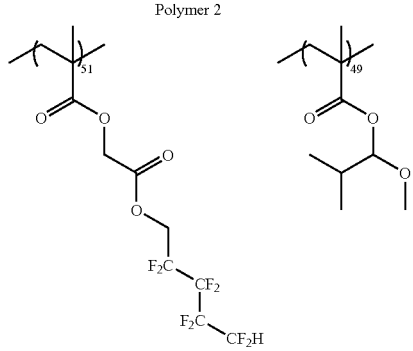
Polymer 3
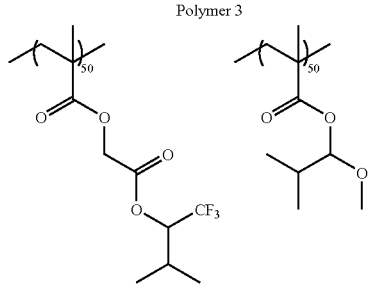
Polymer 4
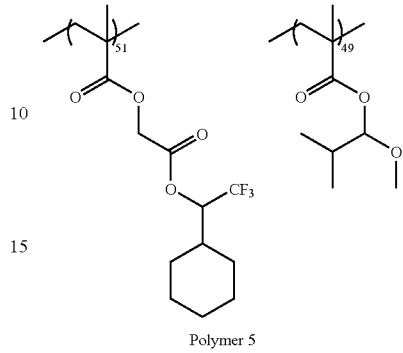
Polymer 5
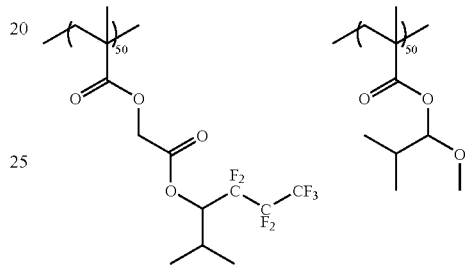
Polymer 6
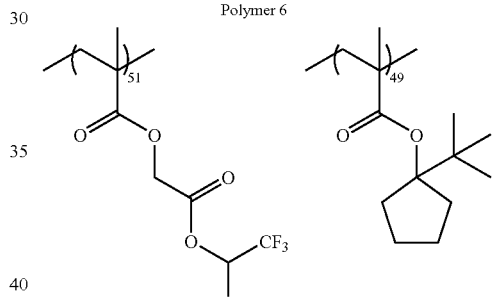
Polymer 7
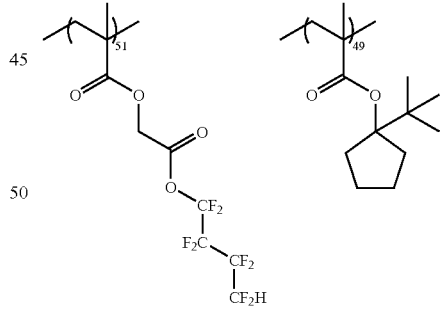
Polymer 8
TABLE 2
| Formulation, mol % | Monomer | | | | | | Yield, % | Mw | Mw/Mn |
|---|---|---|---|---|---|---|---|---|---|
| | 2 | 7 | 9 | 10 | 11 | 12 | | | |
| Polymer 9 | 50 | 50 | | | | | 97.3 | 9,800 | 1.4 |
| Polymer 10 | 50 | | 50 | | | | 98.5 | 9,700 | 1.4 |
| Polymer 11 | 40 | 30 | | | 30 | | 97.0 | 9,600 | 1.4 |
| Polymer 12 | 40 | | | 30 | | 30 | 98.7 | 9,500 | 1.4 |

TABLE 2-continued
| Formulation, mol % | Monomer | | | | | | Yield, % | Mw | Mw/Mn |
| --- | --- | --- | --- | --- | --- | --- | --- | --- | --- |
| | 2 | 7 | 9 | 10 | 11 | 12 | | | |
| Polymer 13 | 40 | | 30 | | | 30 | 98.0 | 9,500 | 1.4 |
| Polymer 14 | 40 | | | 30 | | 30 | 97.3 | 9,600 | 1.4 |
| Polymer 15 | 20 | 30 | | | 10 | 40 | 86.2 | 9,500 | 1.4 |
| Polymer 16 | 30 | 30 | | | 10 | 30 | 84.9 | 9,600 | 1.4 |
| Polymer 17 | 40 | 30 | | | 10 | 20 | 82.2 | 9,200 | 1.4 |
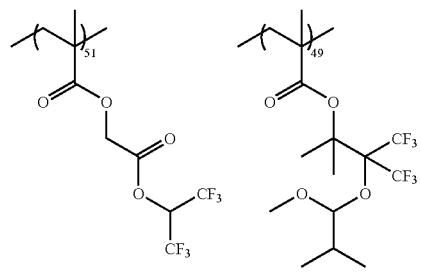
Polymer 9
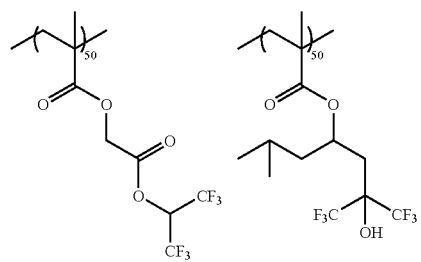
Polymer 10
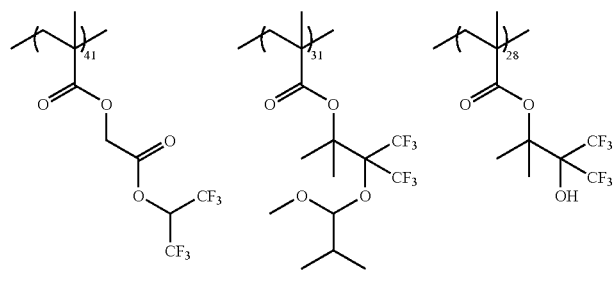
Polymer 11
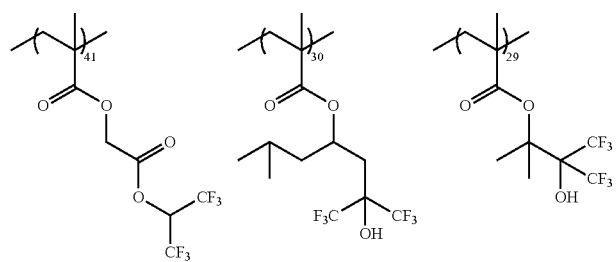
Polymer 12

TABLE 2-continued

| Formulation, mol % | Monomer | | | | | | Yield, % | Mw | Mw/Mn |
|---|---|---|---|---|---|---|---|---|---|
| | 2 | 7 | 9 | 10 | 11 | 12 | | | |

Polymer 13

Polymer 14

Polymer 15

Polymer 16

TABLE 2-continued

| | Monomer | | | | | | | | |
|---|---|---|---|---|---|---|---|---|---|
| Formulation, mol % | 2 | 7 | 9 | 10 | 11 | 12 | Yield, % | Mw | Mw/Mn |

Polymer 17

Comparative Polymer Synthesis Example 1

Synthesis of homopolymer of Monomer 11
(Comparative Polymer 1)

In a nitrogen atmosphere, a flask was charged with 100.0 g of Monomer 11, 3.91 g of dimethyl 2,2'-azobis(isobutyrate), and 100.0 g of isopropyl alcohol to form a monomer solution at a temperature of 20-25° C. In a nitrogen atmosphere, another flask was charged with 50.0 g of isopropyl alcohol, which was heated at 80° C. with stirring. The monomer solution was added dropwise thereto over 4 hours. After the completion of dropwise addition, the polymerization solution was stirred for a further 3 hours while maintaining the temperature of 80° C. At the end of maturing, the solution was cooled to room temperature. The polymerization solution was added dropwise to 2,000 g of water. The polymer thus precipitated was filtered and washed four times with 600 g of a 9/1 hexane/isopropyl ether mixture, whereupon a white solid was separated. The solid was vacuum dried at 50° C. for 20 hours, yielding 92.8 g of the target polymer, designated Comparative Polymer 1. On GPC analysis, the polymer had Mw of 7,800 and Mw/Mn of 1.6.

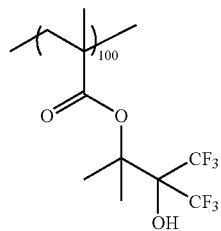

Comparative Polymer Synthesis Example 2

Synthesis of copolymer of Monomers 9 and 10
(Comparative Polymer 2)

In a nitrogen atmosphere, a flask was charged with 53.06 g of Monomer 9, 46.94 g of Monomer 10, 3.21 g of dimethyl 2,2'-azobis(isobutyrate), and 100.0 g of methyl ethyl ketone to form a monomer solution at a temperature of 20-25° C. In a nitrogen atmosphere, another flask was charged with 50.0 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. Using an evaporator, the solvent was evaporated off from the polymerization solution. The resulting white solid was vacuum dried at 50° C. for 20 hours, yielding 98.3 g of the target polymer, designated Comparative Polymer 2. On $^1$H-NMR analysis of its composition, the copolymer consisted of Monomers 9 and 10 in a ratio of 50/50 mol %. On GPC analysis, the copolymer had a Mw of 9,300 and a Mw/Mn of 1.4.

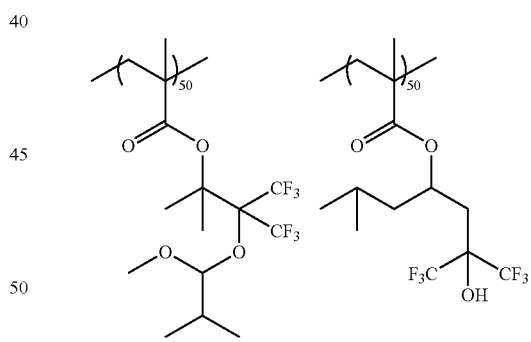

Comparative Polymer Synthesis Example 3

Copolymerization of Monomers 7 and 13 (50/50)
(Comparative Polymer 3)

Comparative Polymer 3 was synthesized using substantially the same formulation as in Comparative Polymer Synthesis Example 2. The copolymer was obtained in a yield of 98.5%, consisted of Monomers 7 and 13 in a ratio of 48/52 mol %, and had a Mw of 9,400 and a Mw/Mn of 1.4.

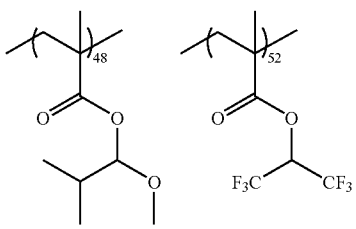

Evaluation of Resist

A resist solution was prepared by dissolving 5 g of Resist Polymer (shown below), 0.25 g of an additive polymer selected from Polymers 1 to 17 and Comparative Polymers 1 to 3, 0.25 g of PAG1 (shown below), 0.05 g of Quencher 1 (shown below), and 0.10 g of 1,1,1,3,3,3-hexafluoroisopropyl alcohol in 75 g of PGMEA and filtering through a polypropylene filter having a pore size of 0.2 μm. As a reference, a resist solution was similarly prepared aside from omitting the additive polymer.

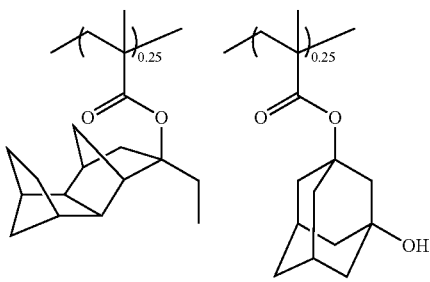

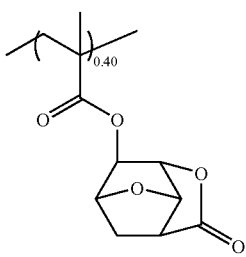

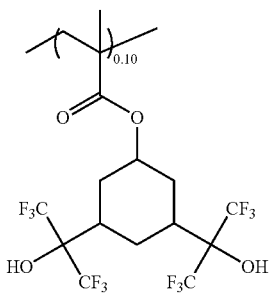

Resist Polymer
Mw = 7,600, Mw/Mn = 1.8

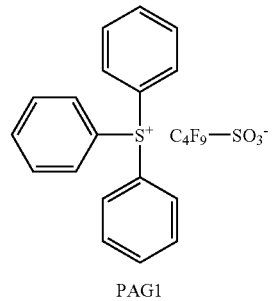

PAG1

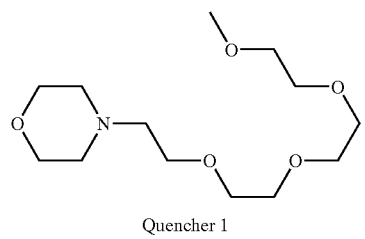

Quencher 1

An antireflective coating ARC-29A (Nissan Chemical Co., Ltd.) was deposited on a silicon substrate to a thickness of 87 nm. The resist solution was applied onto the ARC and baked at 120° C. for 60 seconds to form a resist film of 150 nm thick.

A contact angle with water of the resist film was measured, using an inclination contact angle meter Drop Master 500 by Kyowa Interface Science Co., Ltd. Specifically, the wafer covered with the resist film was kept horizontal, and 50 μL of pure water was dropped on the resist film to form a droplet. While the wafer was gradually inclined, the angle (sliding angle) at which the droplet started sliding down was determined as well as receding contact angle. The results are shown in Table 3.

A smaller sliding angle indicates an easier flow of water on the resist film. A larger receding contact angle indicates that fewer liquid droplets are left during high-speed scan exposure. It is demonstrated in Table 3 that the inclusion of the additive polymer of the invention in a resist solution achieves a drastic improvement in the receding contact angle of photoresist film without adversely affecting the sliding angle, as compared with those photoresist films free of the additive polymer.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of pure water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The results are also shown in Table 3.

It is evident from Table 3 that a photoresist film formed from a resist solution containing the additive polymer according to the invention is effective in inhibiting the PAG from being leached out of the film in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing pure water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are also shown in Table 3.

As seen from Table 3, when exposure is followed by water rinsing, the resist film having the additive polymer according to the invention formulated therein formed a pattern of rectangular profile, in stark contrast with the resist film free of the additive polymer forming a pattern of T-top profile.

TABLE 3

| Additive Polymer | Sliding angle (°) | Receding contact angle (°) | Anion leach-out (ppb) | Sensitivity (mJ/cm²) | 75-nm pattern profile | Contact angle with water after development (°) |
|---|---|---|---|---|---|---|
| Polymer 1 | 14 | 70 | 6 | 31 | rectangular | 46 |
| Polymer 2 | 13 | 73 | 7 | 32 | rectangular | 46 |
| Polymer 3 | 12 | 75 | 7 | 32 | rectangular | 47 |
| Polymer 4 | 13 | 73 | 7 | 31 | rectangular | 46 |
| Polymer 5 | 14 | 73 | 6 | 32 | rectangular | 47 |
| Polymer 6 | 12 | 75 | 6 | 31 | rectangular | 48 |
| Polymer 7 | 15 | 70 | 7 | 31 | rectangular | 46 |
| Polymer 8 | 15 | 71 | 7 | 32 | rectangular | 47 |
| Polymer 9 | 8 | 79 | 7 | 31 | rectangular | 44 |
| Polymer 10 | 8 | 80 | 6 | 31 | rectangular | 44 |
| Polymer 11 | 9 | 77 | 7 | 31 | rectangular | 42 |
| Polymer 12 | 9 | 77 | 6 | 31 | rectangular | 42 |
| Polymer 13 | 9 | 77 | 7 | 31 | rectangular | 41 |
| Polymer 14 | 9 | 77 | 6 | 31 | rectangular | 41 |
| Polymer 15 | 9 | 75 | 7 | 32 | rectangular | 40 |
| Polymer 16 | 8 | 73 | 7 | 32 | rectangular | 40 |
| Polymer 17 | 8 | 71 | 7 | 31 | rectangular | 40 |
| Comparative Polymer 1 | 21 | 60 | 5 | 31 | rectangular | 73 |
| Comparative Polymer 2 | 6 | 91 | 7 | 34 | rectangular | 78 |
| Comparative Polymer 3 | 7 | 89 | 7 | 33 | rectangular | 80 |
| not added | 28 | 40 | 60 | 31 | T-top | 75 |

In a further run, some resist solutions used in the patterning experiment were precision filtered through a high-density polyethylene filter with a pore size of 0.02 µm. An antireflective coating ARC-29A (Nissan Chemical Co., Ltd.) of 87 nm thick was deposited on a 8-inch silicon substrate. The resist solution was applied onto the ARC and baked at 120° C. for 60 seconds to form a resist film of 150 nm thick. Using an ArF scanner model S307E (Nikon Corp., NA 0.85, σ 0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds. Using a flaw detector Win-Win 50-1200 (Tokyo Seimitsu Co., Ltd.), the number of blob defects in the unexposed portion of the checkered-flag was counted at the pixel size of 0.125 µm. The results are shown in Table 4.

TABLE 4

| Additive polymer | Number of defects |
|---|---|
| Polymer 2 | 10 |
| Comparative Polymer 2 | >10,000 |

TABLE 4-continued

| Additive polymer | Number of defects |
|---|---|
| Comparative Polymer 3 | >10,000 |
| not added | >10,000 |

It is evident from Table 4 that in the resist film from the resist solution free of the additive polymer, numerous development defects were observed after the immersion lithography. The defects could not be obviated by adding Comparative Polymer 2 or 3. The resist solution containing the additive polymer according to the invention was effective in minimizing such defects.

Japanese Patent Application No. 2009-100043 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising:
   (A) a polymer comprising recurring units of the following general formula (1a'), recurring units of one or multiple types selected from the following general formulae (2a) to (2f), and recurring units of one or multiple types selected from the following general formulae (3a) to (3e), (40a) to (4e) (5a) to (5c), and (6a) to (6e),
   (B) a polymer which becomes soluble in an alkaline developer under the action of an acid as a base resin,
   (C) a compound capable of generating an acid upon exposure to high-energy radiation, and
   (D) an organic solvent, (1a')

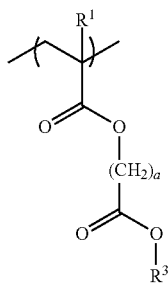

wherein $R^1$ is hydrogen or methyl, $R^{3a}$ is selected from the group consisting of 2,2,2-trifluoroethyl, 3,3,3-trifluoro-1-propyl, 3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl, and "a" is an integer of 1, (2a)

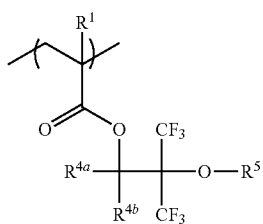

(2b)

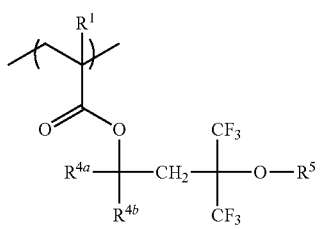

(2c)

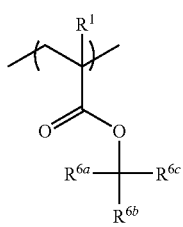

(2d)

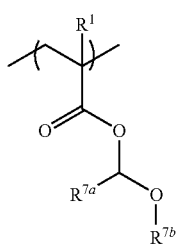

(2e)

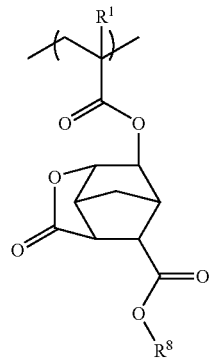

(2f)

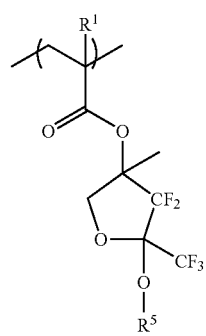

wherein $R^1$ is hydrogen or methyl, $R^{4a}$ and $R^{4b}$ each are hydrogen or a straight, branched or cyclic $C_1$-$C_{15}$ alkyl group, $R^{4a}$ and $R^{4b}$ may bond together to form a $C_3$-$C_8$ non-aromatic ring with the carbon atom to which they are attached, $R^5$ is hydrogen, a straight, branched or cyclic $C_1$-$C_{15}$ alkyl or fluoroalkyl group, or an acid labile group, $R^{6a}$, $R^{6b}$ and $R^{6c}$ each are hydrogen or a straight, branched or cyclic $C_1$-$C_{15}$ alkyl group, $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ alkyl group, $R^{7b}$ is a straight, branched or cyclic $C_1$-$C_{15}$ alkyl group, $R^{7a}$ and $R^{7b}$ may bond together to form a $C_3$-$C_8$-non-aromatic ring with the carbon atom to which they are attached, and $R^8$ is a straight, branched or cyclic $C_1$-$C_{15}$ fluoroalkyl group, (3a)

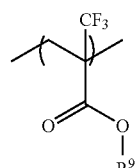

(3b)

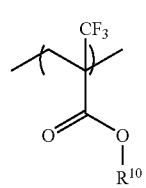

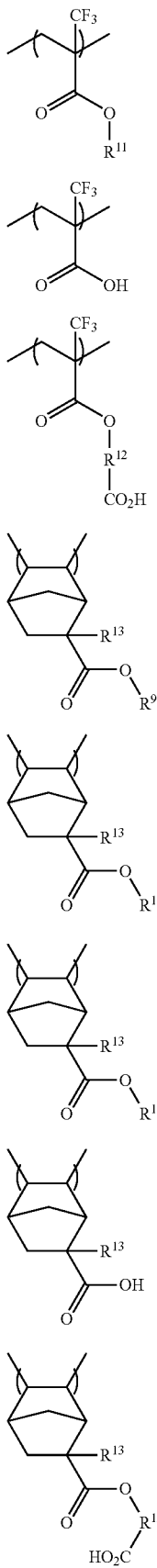

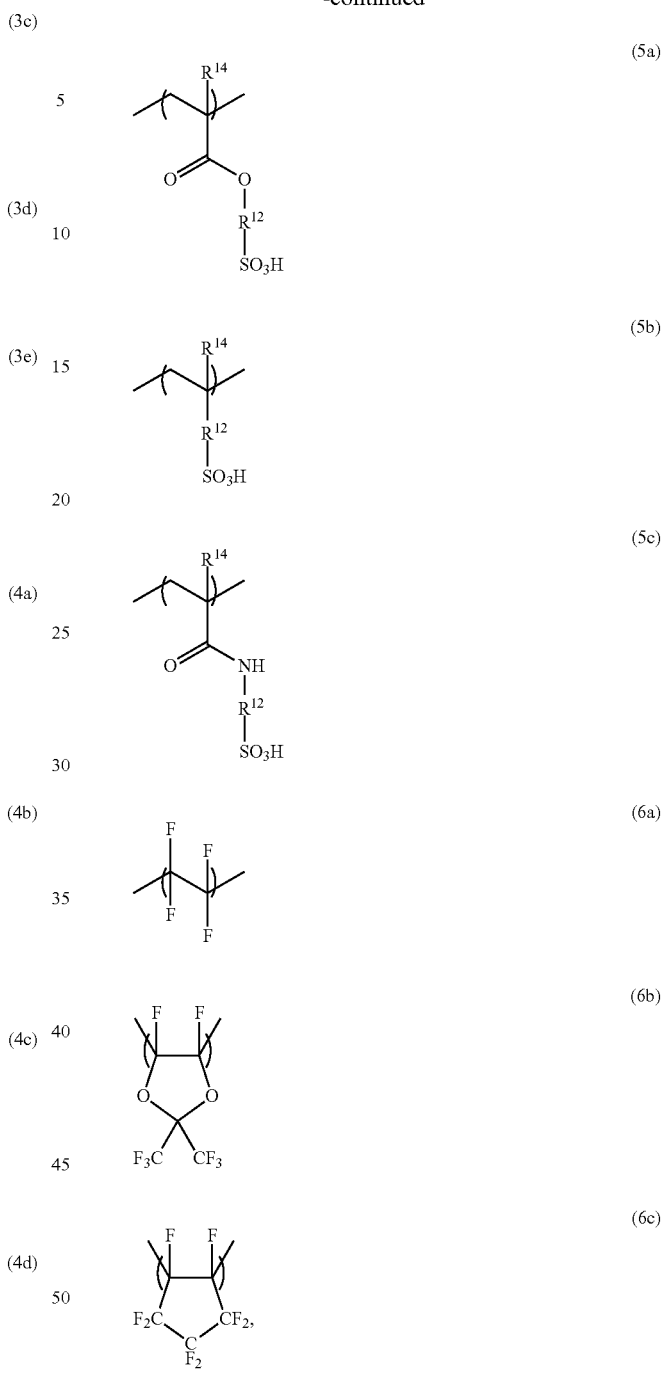

wherein R is a $C_1$-$C_{15}$ alkyl or fluoroalkyl group, $R^{10}$ is an adhesive group, $R^{11}$ is an acid labile group, $R^{12}$ is a single bond or a divalent $C_1$-$C_{15}$ organic group, $R^{13}$ and $R^{14}$ each are hydrogen, methyl or trifluoromethyl.

2. The resist composition of claim 1, wherein the polymer (B) is selected from the group consisting of (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth) acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

3. The resist composition of claim 1, wherein the polymer (A) is present in an amount of 0.1 to 50 parts by weight per 100 parts by weight of the polymer (B).

4. The resist composition of claim 1, further comprising (F) a basic compound.

5. The resist composition of claim 1, further comprising (F) dissolution regulator.

6. A pattern forming process comprising the steps of (1) applying the resist composition of claim 1, onto a substrate to form a resist coating, (2) heat treating the resist coating and exposing it to high-energy radiation through a photomask, and (3) developing the exposed coating with a developer.

7. A pattern forming process comprising the steps of (1) applying the resist composition of claim 1, onto a substrate to form a resist coating, (2) heat treating the resist coating and exposing it to high-energy radiation from a projection lens through a photomask while holding a liquid between the substrate and the projection lens, and (3) developing the exposed coating with a developer.

8. A pattern forming process comprising the steps of (1) applying the resist composition of claim 1, onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

9. The process of claim 7 wherein the liquid is water.

10. The process of claim 6 wherein the high-energy radiation has a wavelength in the range of 180 to 2.50 nm.

11. A pattern forming process comprising the steps of (1) applying the resist composition of claim 1, onto a mask blank to form a resist coating, (2) heat treating and exposing the resist coating in vacuum to electron beam, and (3) developing with a developer.

12. The resist composition of claim 1 wherein the recurring units of the general formula (1a') are the recurring units of the following formula:

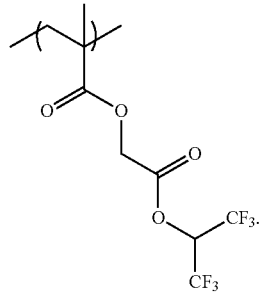

13. A pattern forming process comprising the steps of (1) applying a resist composition onto a substrate to form a resist coating, (2) forming a protective coating onto the resist coating. (3) beat treating and exposing the coated substrate to high-energy radiation from a projection lens through a photomask while holding a liquid between the substrate and the projection lens, and (4) developing with a developer,
said resist composition comprising (A) a polymer comprising recurring units of the following general formula (1a') and recurring units of one or multiple types selected from the following general formulae (2a) to (20, (B) a polymer which becomes soluble in an alkaline developer under the action of an acid as a base resin, (C) a compound capable of generating an acid upon exposure to high-energy radiation, and (D) an organic solvent,

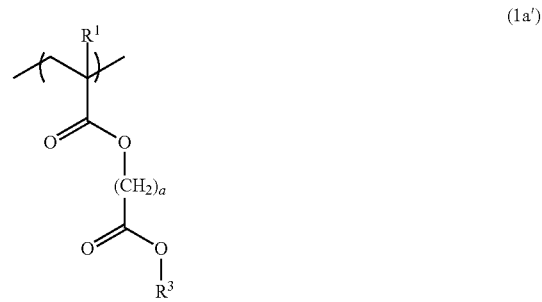

(1a')

wherein $R^1$ is hydrogen or methyl, $R^{3a}$ is selected from the group consisting of 2,2,2-trifluoroethyl, 3,3,3-trifluoro-1-propyl, 3,3,3-trifluoro-2-propyl 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl, and "a" is an integer of 1,

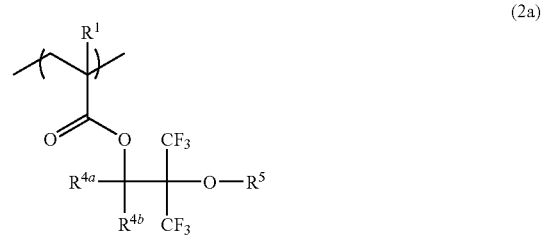

(2a)

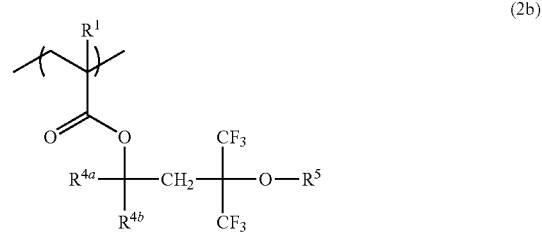

(2b)

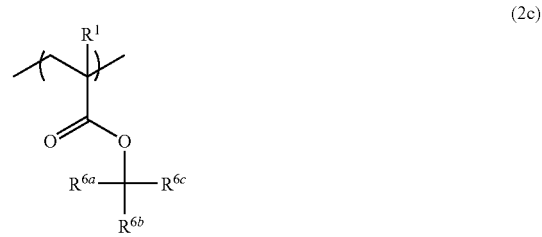

(2c)

-continued (2d) 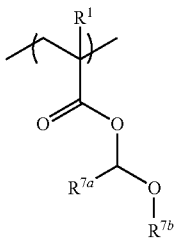

(2e) 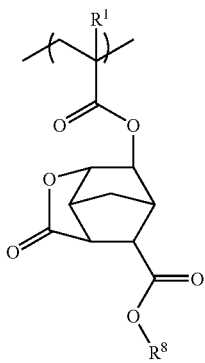

(2f) 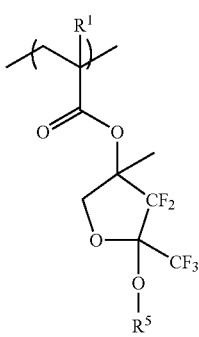

wherein $R^1$ is hydrogen or methyl, $R^{4a}$ and $R^{4b}$ each are hydrogen or a straight, branched or cyclic $C_1$-$C_{15}$ alkyl group, $R^{4a}$ and $R^{4b}$ may bond together to form a $C_3$-$C_5$ non-aromatic ring with the carbon atom to which they are attached, $R^5$ is hydrogen, a straight, branched or cyclic $C_1$-$C_{15}$ alkyl or fluoroalkyl group, or an acid labile group, $R^{6a}$, $R^{6b}$ and $R^{6c}$ each are hydrogen or a straight, branched or cyclic $C_1$-$C_{15}$ alkyl group, $R^{6a}$ and $R^{6b}$, $R^{6a}$ and $R^{6c}$ or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ alkyl group, $R^{7b}$ is a straight, branched or cyclic $C_1$-$C_{15}$ alkyl group, $R^{7a}$ and $R^{7b}$ may bond together to form a $C_3$-$C_8$ non-aromatic ring with the carbon atom to which they are attached, and $R^8$ is a straight, branched or cyclic $C_1$-$C_{15}$ fluoroalkyl group.

14. A pattern forming process comprising the steps of (1) applying a resist composition onto a mask blank to form a resist coating, (2) heat treating and exposing the resist coating in vacuum to electron beam, and (3) developing with a developer, said resist composition comprising (A) a polymer comprising recurring units of the following general formula (1a') and recurring units a one or multiple types selected from the following general formulae (2a) to (2f), (B) a polymer which becomes soluble in an alkaline developer under the action of an acid as a base resin, (C) a compound capable of generating an acid upon exposure to high-energy radiation, and (D) an organic solvent.

(1a') 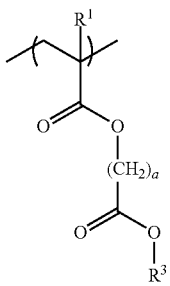

wherein $R^1$ is hydrogen or methyl, $R^{3a}$ is selected from the group consisting of 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl, and "a" is an integer of 1, (2a) 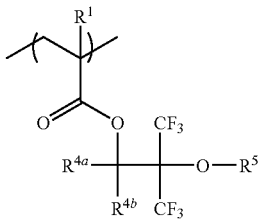

(2b) 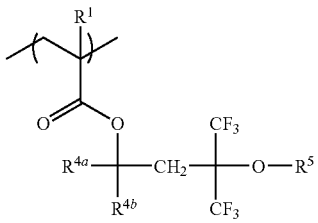

(2c) 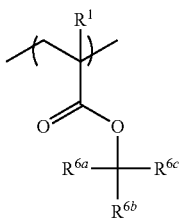

-continued (2d) 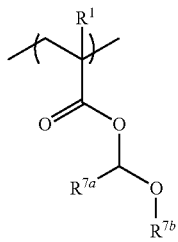

(2e) 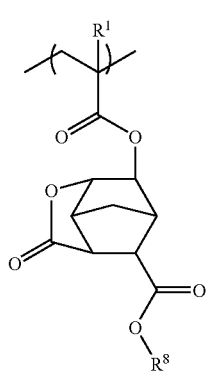

(2f) 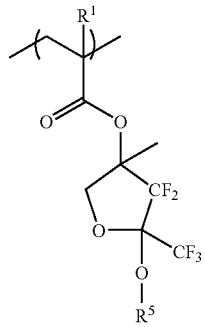

wherein $R^1$ is hydrogen or methyl, $R^{4a}$ and $R^{4b}$ each are hydrogen or a straight, branched or cyclic $C_1$-$C_{15}$ alkyl group, $R^{4a}$ and $R^{4b}$ may bond together to form a $C_3$-$C_8$ non-aromatic ring with the carbon atom to which they are attached, $R^5$ is hydrogen, a straight, branched or cyclic $C_1$-$C_{15}$ alkyl or fluoroalkyl group, or an acid labile group, $R^{6a}$, $R^{6b}$ and $R^{6c}$ each are hydrogen or a straight, branched or cyclic $C_1$-$C_{15}$ alkyl group, $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ alkyl group, $R^{7b}$ is a straight, branched or cyclic $C_1$-$C_{15}$ alkyl group, $R^{7a}$ and $R^{7b}$ may bond together to form a $C_3$-$C_5$ non-aromatic ring with the carbon atom to which they are attached, and $R^8$ is a straight, branched or cyclic $C_1$-$C_{15}$ fluoroalkyl group.

* * * * *

UNITED STATES PATENT AND TRADEMARK OFFICE
CERTIFICATE OF CORRECTION

| | |
|---|---|
| PATENT NO. | : 8,313,886 B2 |
| APPLICATION NO. | : 12/761202 |
| DATED | : November 20, 2012 |
| INVENTOR(S) | : Yuji Harada et al. |

It is certified that error appears in the above-identified patent and that said Letters Patent is hereby corrected as shown below:

ON THE TITLE PAGE:

At item (75), Inventors, change "Tomohiro Kobatashi, Joetsu (JP)" to --Tomohiro Kobayashi, Joetsu (JP)--.

Signed and Sealed this
Twelfth Day of March, 2013

Teresa Stanek Rea
*Acting Director of the United States Patent and Trademark Office*